(12) United States Patent
Frougier et al.

(10) Patent No.: US 12,389,609 B2
(45) Date of Patent: Aug. 12, 2025

(54) CIRCUIT ARCHITECTURE USING TRANSISTORS WITH DYNAMIC DUAL FUNCTIONALITY FOR LOGIC AND EMBEDDED MEMORY DRIVERS

(71) Applicant: INTERNATIONAL BUSINESS MACHINES CORPORATION, Armonk, NY (US)

(72) Inventors: Julien Frougier, Albany, NY (US); Ruilong Xie, Niskayuna, NY (US); Kangguo Cheng, Schenectady, NY (US); Heng Wu, Santa Clara, CA (US); Min Gyu Sung, Latham, NY (US); Chanro Park, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 534 days.

(21) Appl. No.: 18/057,836

(22) Filed: Nov. 22, 2022

(65) Prior Publication Data
US 2024/0172454 A1    May 23, 2024

(51) Int. Cl.
| | |
|---|---|
| *H10B 63/00* | (2023.01) |
| *H03K 19/173* | (2006.01) |
| *H03K 19/20* | (2006.01) |
| *H10B 53/00* | (2023.01) |
| *H10B 61/00* | (2023.01) |
| *H10N 70/20* | (2023.01) |

(52) U.S. Cl.
CPC ......... *H10B 61/22* (2023.02); *H03K 19/1733* (2013.01); *H03K 19/20* (2013.01); *H10B 53/00* (2023.02); *H10B 63/34* (2023.02); *H10N 70/20* (2023.02)

(58) Field of Classification Search
CPC ........ H10B 63/34; H10B 53/00; H10N 70/20; H03K 19/1733; H03K 19/20
See application file for complete search history.

(56) References Cited

U.S. PATENT DOCUMENTS

| | | |
|---|---|---|
| 7,042,768 B2 | 5/2006 | Roohparvar et al. |
| 7,064,376 B2 | 6/2006 | Shau et al. |
| 7,369,438 B2 | 5/2008 | Lee et al. |
| 8,207,757 B1 | 6/2012 | Chen et al. |
| 8,581,349 B1 | 11/2013 | Sekar et al. |
| 8,681,530 B2 | 3/2014 | Wang et al. |
| 8,896,035 B2 | 11/2014 | Murali et al. |

(Continued)

OTHER PUBLICATIONS

Aziz, "Threshold Switch Augmented STT MRAM: Design Space Analysis and Device-Circuit Co-Design", IEEE Transactions on Electron Devices, vol. 65, No. 12, Dec. 2018, 9p.

(Continued)

*Primary Examiner* — Mark V Prenty
(74) *Attorney, Agent, or Firm* — CANTOR COLBURN LLP; Matt Zehrer

(57) ABSTRACT

Embodiments of the invention include a transistor coupled to a memory element, the memory element being in series with a first bistable resistive element that is configured to switch between a first low resistance state and a first high resistance state. A logic circuit is coupled to the transistor via a series connection to a second bistable resistive element, the second bistable resistive element being configured to switch between a second low resistance state and a second high resistance state.

20 Claims, 19 Drawing Sheets

(56) References Cited

U.S. PATENT DOCUMENTS

| | | |
|---|---|---|
| 9,129,894 B2 | 9/2015 | Hashim et al. |
| 9,443,594 B2 | 9/2016 | Jeon et al. |
| 9,792,985 B2 | 10/2017 | Orlowski et al. |
| 9,825,095 B2 | 11/2017 | Pillarisetty et al. |
| 9,853,053 B2 | 12/2017 | Lupino et al. |
| 10,170,520 B1 | 1/2019 | Frougier et al. |
| 10,256,316 B1 | 4/2019 | Frougier et al. |
| 10,447,272 B2 | 10/2019 | Madurawe et al. |
| 10,504,588 B2 | 12/2019 | Lin et al. |
| 2019/0109177 A1 | 4/2019 | Chanemougame et al. |
| 2019/0363131 A1 | 11/2019 | Torng et al. |
| 2024/0172454 A1* | 5/2024 | Frougier ............... H10B 63/34 |

OTHER PUBLICATIONS

Hanyu, "Special Session 8B: New Topic MOS/MTJ-Hybrid Circuit with Nonvolatile Logic-in-Memory Architecture and Its Impact", 2010 28th IEEE VLSI Test Symposium, 2010, 1p.

* cited by examiner

LOGIC-MODE

NVM DRIVER-MODE

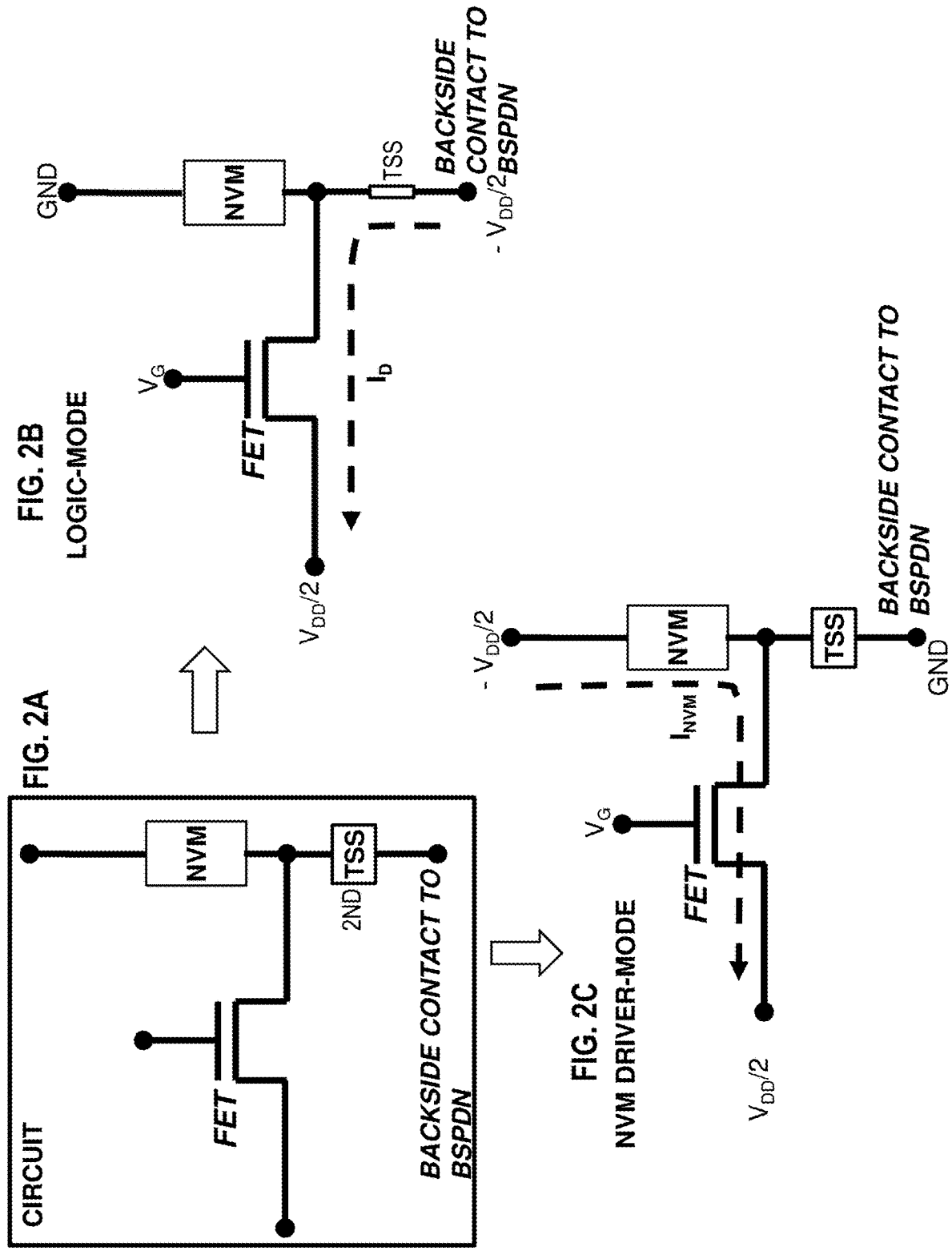

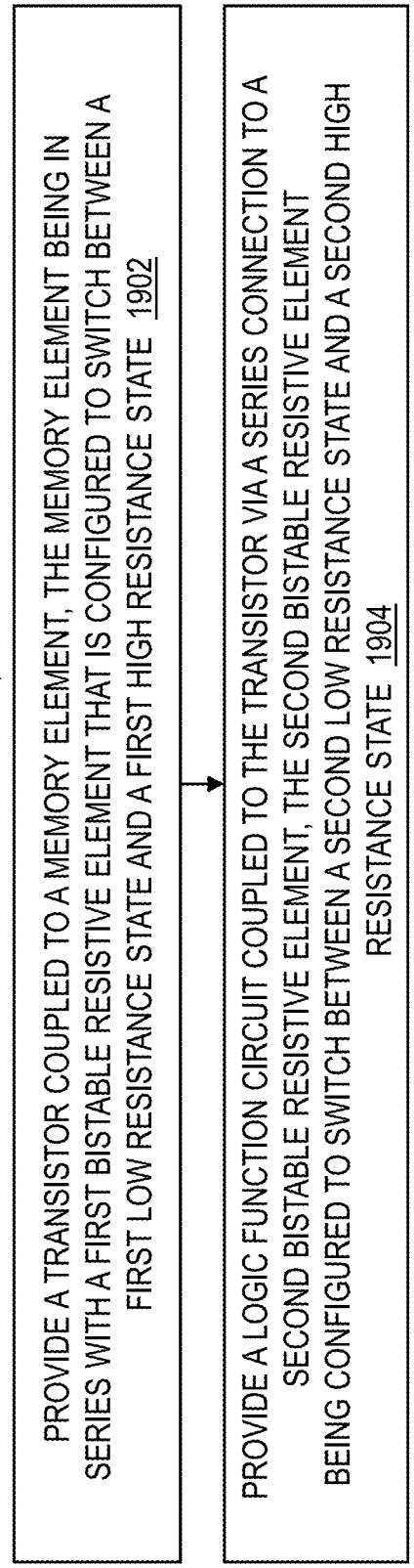

CIRCUIT ARCHITECTURE USING TRANSISTORS WITH DYNAMIC DUAL FUNCTIONALITY FOR LOGIC AND EMBEDDED MEMORY DRIVERS

BACKGROUND

The present invention generally relates to fabrication methods and resulting structures for integrated circuits (ICs), and more specifically, to fabrication methods and resulting structures configured and arranged to provide a new circuit architecture using transistors with dynamic dual functionality for logic and embedded memory drivers.

ICs (also referred to as a chip or a microchip) include electronic circuits on a wafer. The wafer is a semiconductor material, such as, for example, silicon or other materials. An IC is formed of a large number of devices, such as transistors, capacitors, resistors, etc., formed in layers of the IC and interconnected with wiring in the back-end-of-line (BEOL) layers of the wafer. on the wafer. Typical ICs are formed by first fabricating individual semiconductor devices using processes referred to generally as the front-end-of-line (FEOL). A metal-oxide-semiconductor field-effect transistor (MOSFET) is a transistor used for amplifying or switching electronic signals. The MOSFET has a source, a drain, and a metal oxide gate electrode. A conventional FET is a planar device where the entire channel region of the device is formed parallel and slightly below the planar upper surface of the semiconducting substrate. In contrast to a planar FET, there are so-called three-dimensional (3D) devices, such as a FinFET device, which is a three-dimensional structure. One type of device that shows promise for advanced integrated circuit products of the future is generally known as a nanosheet transistor. In general, a nanosheet transistor has a fin-type channel structure that includes a plurality of vertically spaced-apart sheets of semiconductor material. A gate structure for the device is positioned around each of these spaced-apart layers of channel semiconductor material.

SUMMARY

Embodiments of the present invention are directed to providing fabrication methods and resulting structures for a new circuit architecture using transistors with dynamic dual functionality for logic and embedded memory drivers. A non-limiting method includes providing a transistor coupled to a memory element, the memory element being in series with a first bistable resistive element that is configured to switch between a first low resistance state and a first high resistance state. The method includes providing a logic circuit coupled to the transistor via a series connection to a second bistable resistive element, the second bistable resistive element being configured to switch between a second low resistance state and a second high resistance state.

Other embodiments of the present invention implement features of the above-described devices/structures in methods and/or implement features of the methods in devices/structures.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 2A is a schematic of a portion of a new circuit architecture using transistors with dynamic dual functionality for logic and embedded memory drivers according to one or more embodiments of the invention;

FIG. 2B is a schematic of a portion of the new circuit architecture using same the transistor to operate the circuit in logic mode according to one or more embodiments of the invention;

FIG. 2C is a schematic of a portion of the new circuit architecture using the same transistor to operate the circuit in memory driver mode according to one or more embodiments of the invention;

FIG. 19 is a flowchart of a computer-implemented method of providing a new circuit architecture using the same transistors with dynamic dual functionality for logic and embedded memory drivers according to one or more embodiments of the invention.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

One or more embodiments of the invention provide fabrication methods and resulting structures for a new circuit architecture using transistors with dynamic dual functionality for logic and embedded memory drivers. One or more embodiments provide a stacked logic and non-volatile memory circuit using the same field-effect transistors for both the logic functions and non-volatile memory drivers. In one example, the IC may be a motherboard where the logic is routed through the back of the wafer via a backside power delivery network while the embedded memory is routed via a standard back-end-of-line structure. In one or more embodiments, the configuration may be reversed such that embedded memory is routed through the back of the wafer via a backside power delivery network while the logic is routed via a standard back-end-of-line structure. As one or more technical solutions and benefits, the circuit with the same transistors utilized from both logic and embedded memory drivers shrinks the required number of devices on a chip for the same area, increases the number of field-effect transistors/memory cells in a fixed chip area, and/or reduces power consumption by leveraging dual functionality of field-effect transistors for both the logic and memory drivers.

Figure 1A:
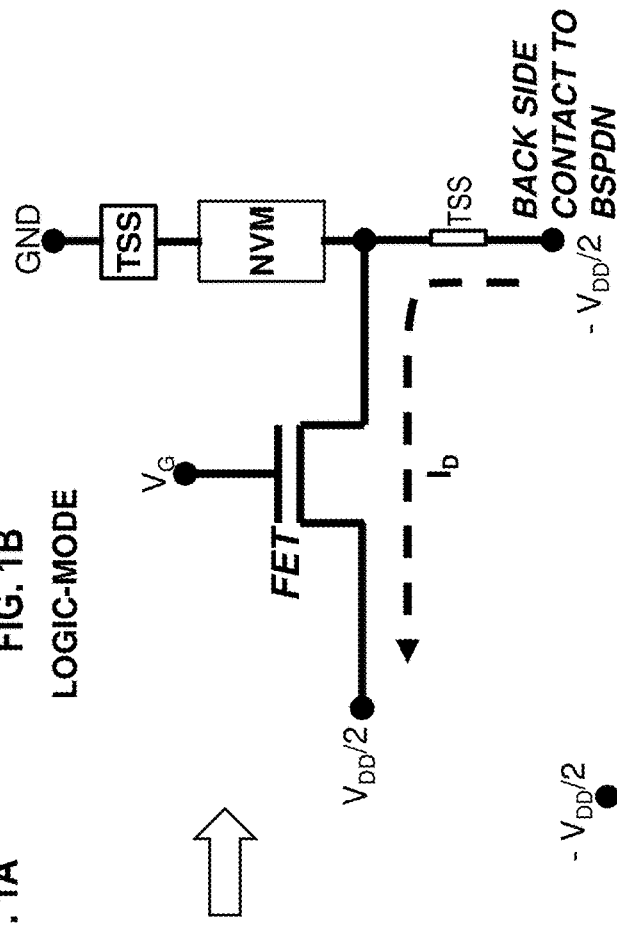
FIG. 1A is a schematic of a portion of a new circuit architecture using transistors with dynamic dual functionality for logic and embedded memory drivers according to one or more embodiments of the invention.

Turning now to a more detailed description of aspects of the present invention, FIG. 1A is a schematic of a portion of a new circuit architecture using transistors with dynamic dual functionality for logic and embedded memory drivers according to one or more embodiments. The circuit includes a field-effect transistor (FET) connected to a memory element (e.g., non-volatile memory element (NVM)) in series with a first threshold switching selector (TSS) along one branch. The circuit includes the FET connected to a second TSS in series with a logic circuit in a backside power delivery network (BSPDN) along another branch. The first TSS and second TSS each have a high resistance state and a low resistance state. The same FET is utilized to operate the circuit in a logic mode and a memory drive mode.

Figure 1B:
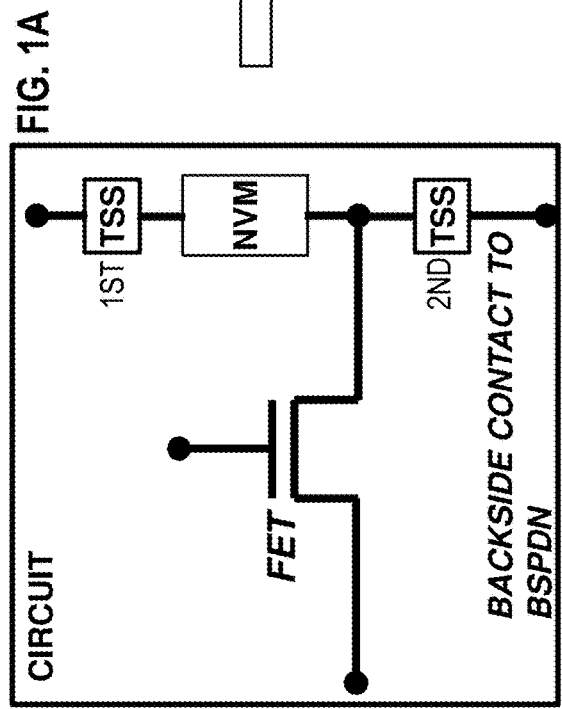
FIG. 1B is a schematic of a portion of the new circuit architecture using same the transistor to operate the circuit in a logic mode according to one or more embodiments of the invention.

FIG. 1B is a schematic of a portion of the new circuit architecture using the same transistor to operate the circuit in logic mode according to one or more embodiments. In FIG. 1B, the first threshold switching selector (TSS) is in a high resistance state while the second TSS is in a low resistance state, thereby allowing drain current ($I_D$) to flow from a negative voltage source (e.g., $-V_{DD}/2$), through the logic circuit (e.g., one or more logic elements in various combinations including OR gates, AND gates, NOR gates, etc.) through the back side power delivery network (BSPDN) layer (e.g., BSPDN layer 1002 in FIG. 10), through the second TSS in the low resistance state, and through the FET toward a positive voltage source (e.g., $V_{DD}/2$). The first TSS acts a series resistance with the non-volatile memory element and eliminates the risk of parasitic currents through the NVM element to the FET, by blocking electrical current from flowing. The BSPDN includes one or more logic circuit routings to logic circuits for implementing their logic function by inter-connecting transistors, in which the logic elements (e.g., OR gates, AND gates, NOR gates, etc.) are driven (turned on for logic operations) by the electrical current. It is assumed that gate voltage ($V_G$) is applied at the gate to turn on the FET (e.g., a positive gate voltage for an N-type FET (NFET) or a negative gate voltage for a P-type FET (PFET)) as known in the art.

Figure 1C:
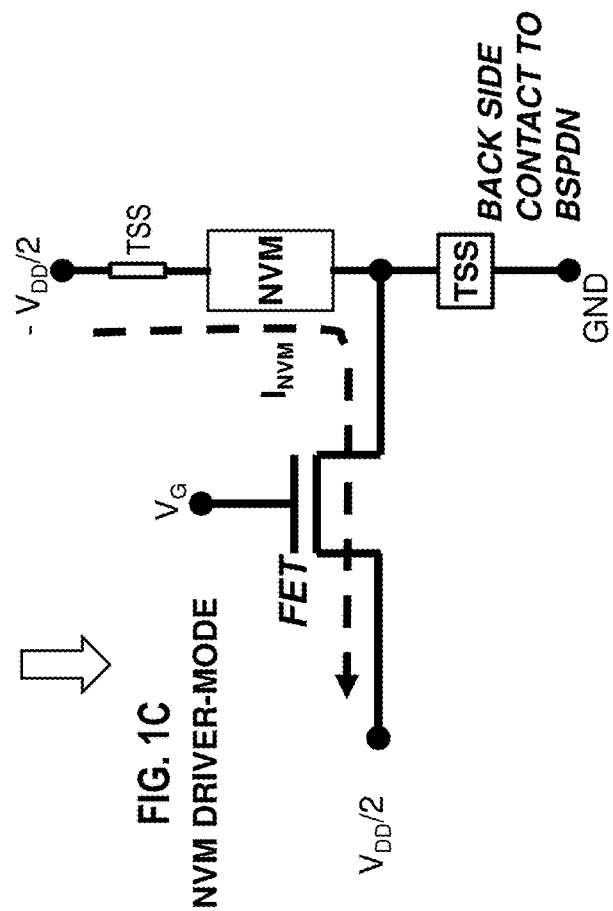
FIG. 1C is a schematic of a portion of the new circuit architecture using the same transistor to operate the circuit in memory driver mode according to one or more embodiments of the invention.

FIG. 1C is a schematic of a portion of the new circuit architecture using the same transistor to operate the circuit in memory driver mode according to one or more embodiments. In FIG. 1C, the first TSS is in a low resistance state while the second TSS is in a high resistance state, thereby allowing electric current (e.g., $I_{NVM}$) to flow from a negative voltage source ($-V_{DD}/2$), through the NVM element, and through the FET toward the positive voltage source ($V_{DD}/2$). The second TSS switching selector acts as a series resistance with the logic circuit and eliminates the risk of parasitic currents from the logic circuit (element) to the FET, by blocking electrical current from flowing. The NVM element is connected to a memory array circuit (row decoder, column decoder, sense amplifier, analog-to-digital converter, etc.) through which electrical current flows. Particularly, the electrical current ($I_{NVM}$) is used to drive the NVM memory element for write/red operations by passing through one or more element of the memory circuit (not shown). As noted above, it is assumed that gate voltage ($V_G$) is applied at the gate to turn on the FET (e.g., NFET or PFET) as known in the art.

FIG. 2A is a schematic of a portion of a new circuit architecture using transistors with dynamic dual functionality for logic and embedded memory drivers according to one or more embodiments. FIG. 2B is a schematic of a portion of the new circuit architecture using same the transistor to operate the circuit in logic mode according to one or more embodiments. FIG. 2C is a schematic of a portion of the new circuit architecture using the same transistor to operate the circuit in memory driver mode according to one or more embodiments. The circuit in FIGS. 2A, 2B, and 2C is analogous to the circuit in FIGS. 1A, 1B, and 1C except no first TSS is connected in series with the NVM element in the circuit. In this case, the NVM element is configured to have resistance levels much higher than the low resistance state of the second TSS in order to block parasitic electrical current from flowing through the NVM element, while allowing electrical current to flow through the logic circuit and the second TSS. Also, the resistance levels of the NVM element are lower than the high resistance state of the second TSS, thereby allowing electrical current to flow through the NVM element in such as case. As seen in FIGS. 2A, 2B, and 2C, the circuit includes the FET connected to a memory element (e.g., non-volatile memory element (NVM)) but no first TSS is present along one branch. The circuit includes the FET connected to the second TSS in series with logic circuit in the BSPDN along another branch. The second TSS has a high resistance state and a low resistance state. Again, the same FET is utilized to operate the circuit in both the logic mode and the memory driver mode.

FIG. 2B is a schematic of a portion of the new circuit architecture using same the transistor to operate the circuit in logic mode according to one or more embodiments. In FIG. 2B, even without the first TSS in a high resistance state, the resistance of the NVM element is high such that it will prevent parasitic current leakage through the NVM. The NVM element is designed with resistance states that are higher than the low resistance state of the second TSS in series with the logic circuit. While the second TSS is in a low resistance state, the high resistance of the NVM element blocks parasitic electrical current, thereby allowing drain current ($I_D$) to flow from a negative voltage source (e.g., $-V_{DD}/2$), through the logic circuit (e.g., one or more logic elements in various combination include OR gates, AND gates, etc.) via the BSPDN, through the second TSS in the low resistance state, and through the FET toward a positive voltage source (e.g., $V_{DD}/2$). As noted herein, the NVM element has a resistance level, which is higher than the low resistance state of the second TSS, thereby eliminating the risk of parasitic currents from the NVM element to the FET. As noted above, the BSPDN includes one or more logic circuit routings to logic circuits for implementing their logic function by inter-connecting transistors, in which the logic elements (e.g., OR gates, AND gates, NOR gates, etc.) are driven (turned on for logic operations) by the electrical current. Again, it is assumed that gate voltage ($V_G$) is applied at the gate to turn on the FET (e.g., positive gate voltage for an N-type FET (NFET) or a negative gate voltage for a P-type FET (PFET) as known in the art.

FIG. 2C is a schematic of a portion of the new circuit architecture using the same transistor to operate the circuit in memory driver mode according to one or more embodiments. In FIG. 2C, the second TSS is in a high resistance state that is greater than the resistance levels of the NVM element, thereby allowing electric current (e.g., $I_{NVM}$) to flow from a negative voltage source ($-V_{DD}/2$), through the NVM element, and through the FET toward the positive voltage source ($V_{DD}/2$). The second TSS acts a series resistance with the logic circuit and eliminates the risk of parasitic currents from the logic circuit (element) to the FET, by blocking parasitic electrical current from flowing. As noted herein, the NVM element is connected to a memory array circuit (row decoder, column decoder, sense amplifier, analog-to-digital converter, etc.) through which electrical current flows. Particularly, the electrical current ($I_{NVM}$) is used to drive the NVM memory element. As noted above, it is assumed that gate voltage ($V_G$) is applied at the gate to turn on the FET (e.g., NFET or PFET) as known in the art.

The threshold switching selector (TSS) is a bistable resistive system. A bistable resistive system is a system exhibiting a unipolar abrupt reversible and electrically triggered resistance switch between two stable resistance states. The bistable resistive system exhibits electrically-induced abrupt resistivity change such as for insulator-to-metal transition (IMT) materials or the threshold switching selector (TSS). The high-resistivity insulating state (HRS) reduces the current flowing through the system ($I_{OFF}$) while the abrupt resistance switching to the low-resistivity metallic state (LRS) results in negligible reduction of the on-state drive current ($I_{ON}$). Insulator-to-metal transition (IMT) materials (including relaxed, strained, 3D-bulk, thin film, 2D-nanosheet, 1D-nanowire) include materials, for example, such as $VO_2$, $NbO_2$, $Ca_2RuO_4$, $LaCoO_3$, $Ti_2O_3$, $Ti_3O_5$, $SmNiO_3$, $NdNiO_3$, $V_2O_3$, $V_4O_7$, $Fe_3O_4$, etc., and any oxides of the form $ABO_3$ Perovskite. Threshold switching selectors (TSS) may be based on the combination of a thin insulator layer with a metal, for example, such as $Ag/HfO_2$, $Cu/HfO_2$, $Ag/TiO_2$, $Cu_xS$, $Ag/a$-Si, $AgTe/TiN/TiO_2/TiN$, etc.

Now turning to figures of fabricating a semiconductor structure, fabrication processes are provided for forming an integrated circuit (IC) for the new circuit architecture using transistors with dynamic dual functionality for logic and embedded memory drivers. FIGS. 3-18 illustrate cross-sectional views of an IC 300 according to one or more embodiments. Standard semiconductor fabrication techniques can be utilized to fabricate IC 300 as understood by one of ordinary skill in the art. Any suitable lithography processes including deposition techniques and etching techniques can be utilized herein.

Figure 3:
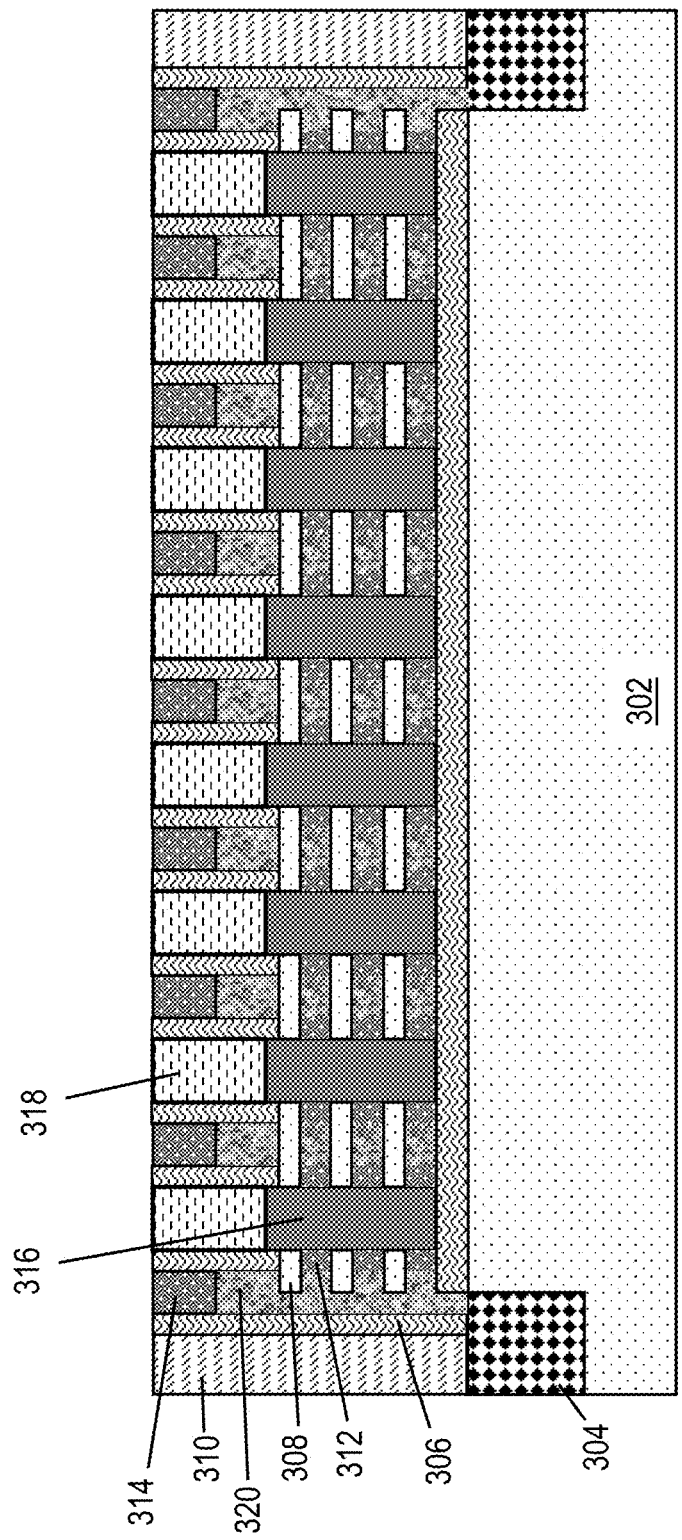
FIG. 3 depicts a cross-sectional view of a portion of an IC under-fabrication after fabrication operations according to one or more embodiments of the invention.

FIG. 3 depicts a cross-sectional view of a portion of the IC 300 starting with a wafer where several fabrication processes have been performed. Front-end-of-line (FEOL) transistors are formed using known fabrication processes. Although one or more embodiments illustrate gate-all-around (GAA) nanosheet FETs for explanation purposes, it should be appreciated that embodiments of the invention are not limited to GAA FETs. Embodiments of the invention apply to any other types of transistor architectures, for example, such as planar FETs, FinFETs, nanowire-FETs, vertical transport FET, etc.

The IC 300 includes transistors formed on a wafer or substrate 302. The wafer or substrate 302 may be formed of (pure) silicon and/or silicon doped with impurities. Other suitable materials can be utilized for the substrates. The transistors include channel layers 308 utilized as the channel regions for the FET device. Material of the channel layers 308 may include silicon. The channel layers 308 are coupled to epitaxial materials 316 which are sources and drains. The epitaxial materials 316 may be P-type epitaxial material, resulting in P-type source and drain regions. The epitaxial materials 316 may be N-type epitaxial material, resulting in N-type source and drain regions. Source/drain contacts 318 are formed on (source/drain) epitaxial materials 316. The source/drain contacts 318 can include trench metals along with silicide. The trench metals may include titanium, tungsten, cobalt, etc.

Inner spacers 312 are formed between the channel layers 308. Example materials of the inner spacers 312 may include SiBCN, SiOCN, SiN, SiOC, SiC, etc. The transistors include gate materials 320. Gate caps 314 are formed on the gate materials 320. The gate caps 314 may be an insulating material, dielectric material, etc. Gate contacts (not shown) are formed on the gate materials 320 for applying gate voltage. The IC 300 includes shallow trench isolation (STI) regions 304 and interlayer dielectric (ILD) material 310. The STI regions 304 may include one or more dielectric materials such as $SiO_2$. The STI regions 304 may include a low-k or ultralow-k dielectric material. The ILD material 310 (along with other ILD layers herein) may include low-k or ultralow-k dielectric materials. Gate spacer material 306 is formed, and a horizontal layer of the gate spacer material 306 forms a bottom dielectric isolation layer. Example materials of the gate spacer material 306, including the bottom dielectric isolation layer, may include SiN, SiBCN, SiOCN, SiOC, etc.

Low-k dielectric materials may generally include dielectric materials having a k value of about 3.9 or less, such as silicon dioxide. The ultralow-k dielectric material generally includes dielectric materials having a k value less than 2.5. Unless otherwise noted, all k values mentioned in the present application are measured relative to a vacuum. Exemplary ultralow k dielectric materials generally include porous materials such as porous organic silicate glasses, porous polyamide nanofoams, silica xerogels, porous hydrogen silsequioxane (HSQ), porous methylsilsesquioxane (MSQ), porous inorganic materials, porous CVD materials, porous organic materials, or combinations thereof. The ultralow-k dielectric material can be produced using a templated process or a sol-gel process as is generally known in the art. In the templated process, the precursor typically contains a composite of thermally labile and stable materials. After film deposition, the thermally labile materials can be removed by thermal heating, leaving pores in the dielectric film. In the sol gel process, the porous low k dielectric films can be formed by hydrolysis and polycondensation of an alkoxide(s) such as tetraetehoxysilane (TEOS).

Figure 4:
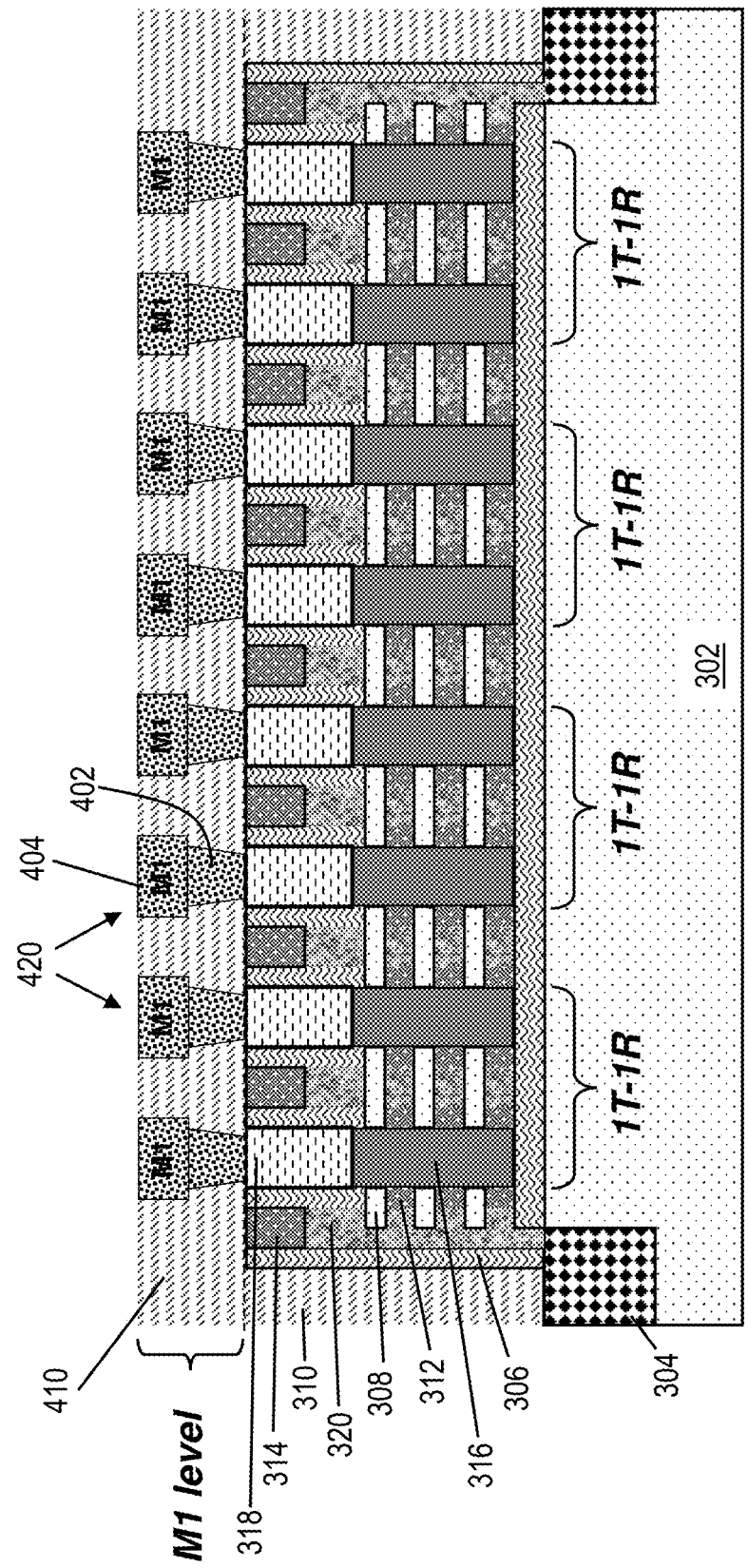
FIG. 4 depicts a cross-sectional view of a portion of an IC under-fabrication after fabrication operations according to one or more embodiments of the invention.

FIG. 4 depicts a cross-sectional view of a portion of the IC 300 under-fabrication after fabrication operations. FIG. 4 illustrates middle-of-line (MOL) processing and/or back-end-of-line (BEOL) processing on the front side of the wafer. In the M1 level (e.g., metal layer 1 level), interconnect structures 420 are formed in ILD material 410. The interconnect structures 420 are formed in contact with respective source/drain contacts 318. Each of the interconnect structures 420 includes a metal via 402 connected to a metal line 404.

Figure 5:
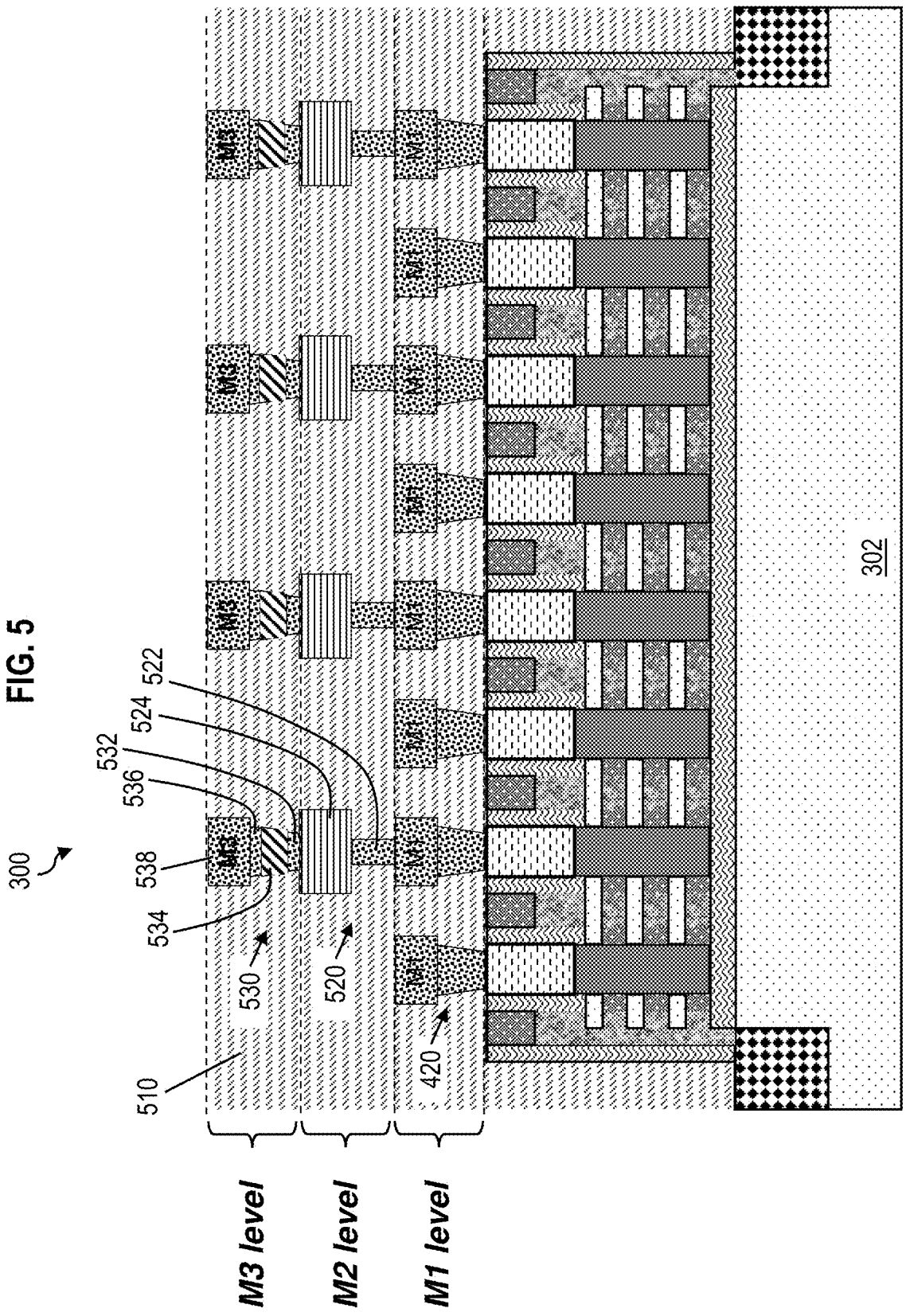
FIG. 5 depicts a cross-sectional view of a portion of an IC under-fabrication after fabrication operations according to one or more embodiments of the invention.

FIG. 5 depicts a cross-sectional view of a portion of the IC 300 under-fabrication after fabrication operations. FIG. 5 illustrates forming embedded memory elements and threshold switching selector (TSS) in series. During further MOL processing, the M2 level and M3 level are formed. In the M2 level, a structure 520 is formed in ILD material 510. The structure 520 includes an NVM bottom contact 522 in contact with the metal line 404 of the interconnect structure 420 and a memory element 524. The memory elements 524 are two-terminal memory devices. Examples of the memory elements 524 may include magnetoresistive random-access memory (MRAM), spin-transfer torque magnetic random-access memory (STT-MRAM), resistive random access memory (RRAM), phase-change random access memory (PCRAM), conductive bridging random access memory (CBRAM), ferroelectric random access memory (FeRAM), etc.

In the M3 level, a structure 530 is formed on the structure 520. The structure 530 includes a bistable resistive element such as a TSS device 534, where the TSS device 534 is sandwiched between metal via 532 and metal via 536. The structure 530 also includes (M3) metal line 538. It should be noted that the metal vias 532 and 536 (as well as metal vias 532A and 536A and metal vias 1532 and 1536 discussed below) are not simply vias per se. The TSS is integrated in the via itself. Depending on the material used for the bistable resistive element, different types of conductive materials (metals for example) are chosen for the vias to work in conjunction with the switching material. As such, the metal vias 532 and 536 can be different conductive materials.

The vias 402, (M1) metal lines 404, an NVM bottom contacts 522, vias 532, vias 536, and (M3) metal lines 538 are formed of electrically conductive materials including metals, metal alloys, etc., as known in the art for MOL and BEOL processing.

The example illustrated in FIG. 5 depicts a 1T-1R configuration which may use MRAM integrated at the M2 level. Although the 1T-1R is illustrated, more than 1 transistor (1T) can be utilized to drive 1 memory element (1R). For example, a 2T-1R configuration can be utilized where 2 transistors are utilized to drive 1 memory element (1R). Other configurations are contemplated. Although the memory elements 524 are shown at the M2 level, the memory elements 524 can be integrated at different MOL/BEOL levels. Similarly, although the TSS devices 534 are illustrated at the M3 level, the TSS devices 534 can be integrated at different MOL/BEOL levels. In one or more embodiments, the memory elements 524 and the TSS devices 534 can be integrated in the same metal level. In one or more embodiments, the memory elements 524 and TSS devices 534 can be implemented on the backside of the wafer as discussed herein.

Figure 6:
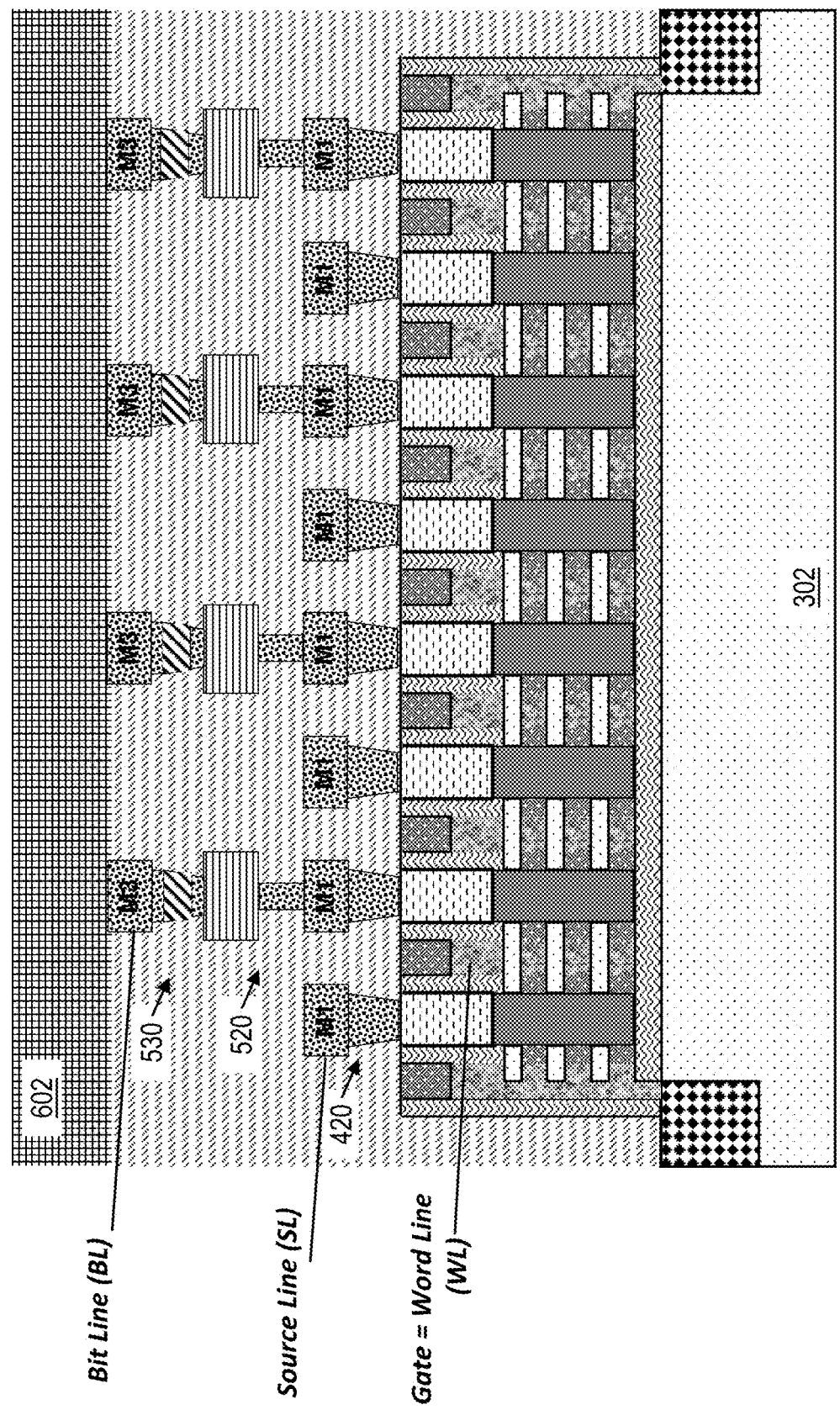
FIG. 6 depicts a cross-sectional view of a portion of an IC under-fabrication after fabrication operations according to one or more embodiments of the invention.

FIG. 6 depicts a cross-sectional view of a portion of the IC 300 under-fabrication after fabrication operations. As part of the BEOL processing and/or far BEOL processing, FIG. 6 illustrates formation of a BEOL layer 602 that represents routing to memory array circuits (row decoder, column decoder, sense amplifier, analog-to-digital converter, etc.) as understood by one of ordinary skill in the art. The details of the BEOL layer 602 with its memory array circuits are not illustrated for conciseness, but it is understood that the memory array circuits are present and operatively connected in the BEOL layer 602. For example, at least one or more memory circuits are operatively connected to each of the memory elements 524, respectively.

For the operation of an individual memory element 524, FIG. 6 illustrates that the M3 metal line corresponds to the bit line (BL), the M1 metal line 404 corresponds to the source line (SL), and the gate material 320 corresponds to the word line (WL). Accordingly, voltage (or signals) is appropriately applied to the bit line, the source line, and the word line to read and write to the memory element 524 as desired.

Figure 7:
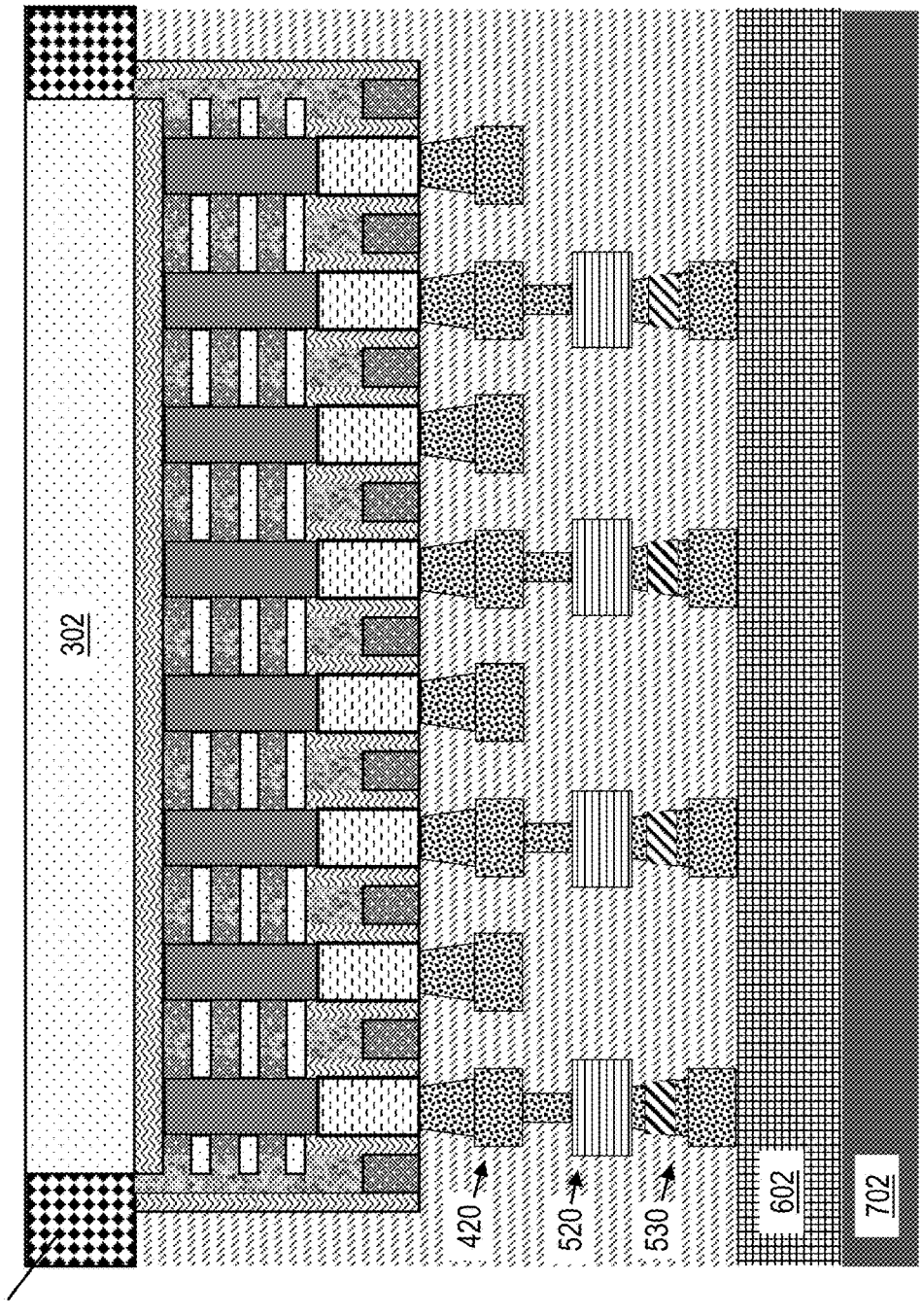
FIG. 7 depicts a cross-sectional view of a portion of an IC under-fabrication after fabrication operations according to one or more embodiments of the invention.

FIG. 7 depicts a cross-sectional view of a portion of the IC 300 under-fabrication after fabrication operations. In preparation for future backside power delivery network integration, before flipping the wafer, a sacrificial carrier wafer 702 is attached to the BEOL layer 602. The carrier wafer 702 may be silicon and/or any other suitable material. The wafer is flipped, and chemical mechanical polishing/planarization (CMP) is performed on the substrate 302 to make the substrate 302 coplanar with the STI regions 304.

Figure 8:
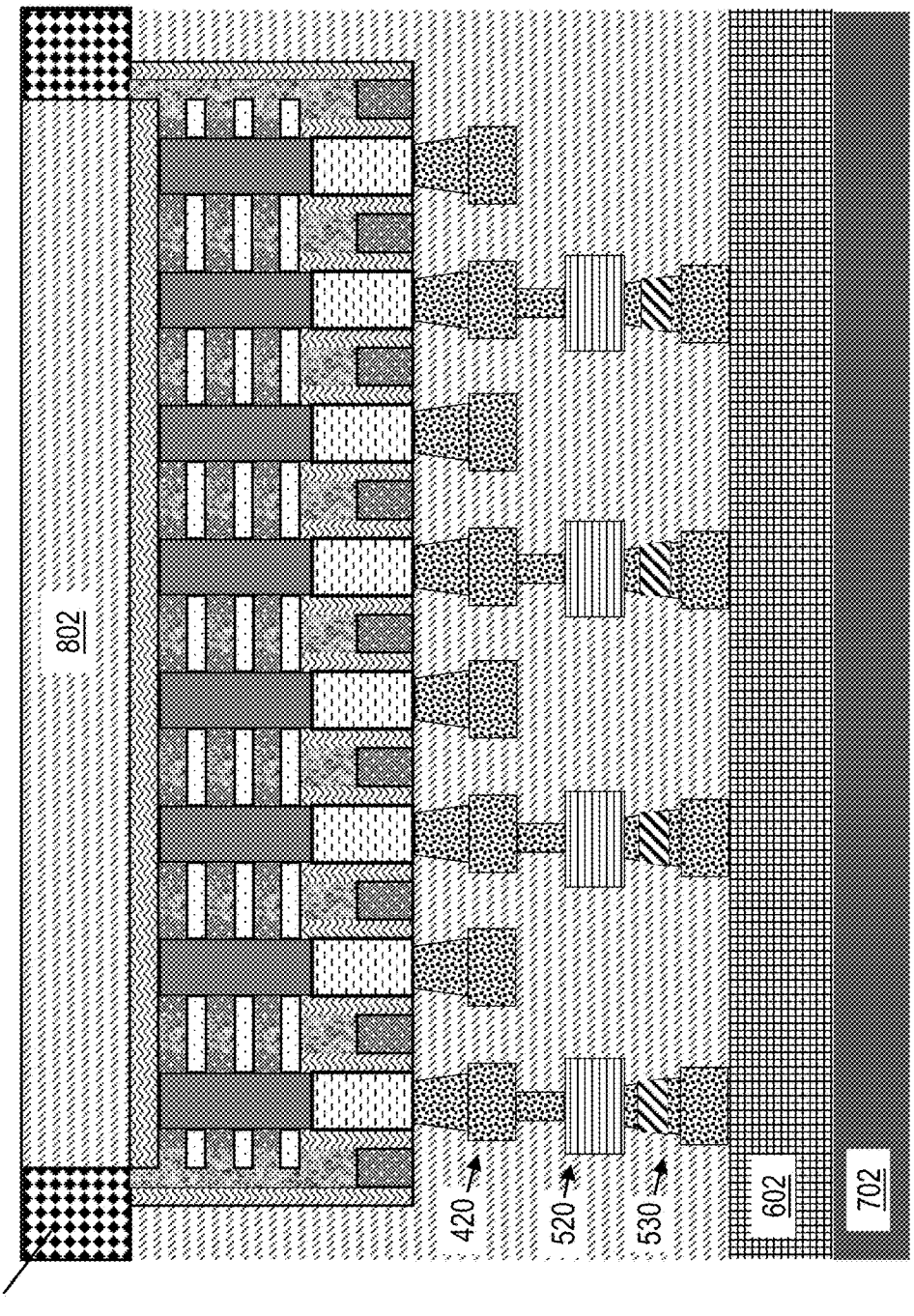
FIG. 8 depicts a cross-sectional view of a portion of an IC under-fabrication after fabrication operations according to one or more embodiments of the invention.

FIG. 8 depicts a cross-sectional view of a portion of the IC 300 under-fabrication after fabrication operations. FIG. 8 illustrates substrate etch back of the substrate 302, ILD material 802 deposition, and CMP.

Figure 9:
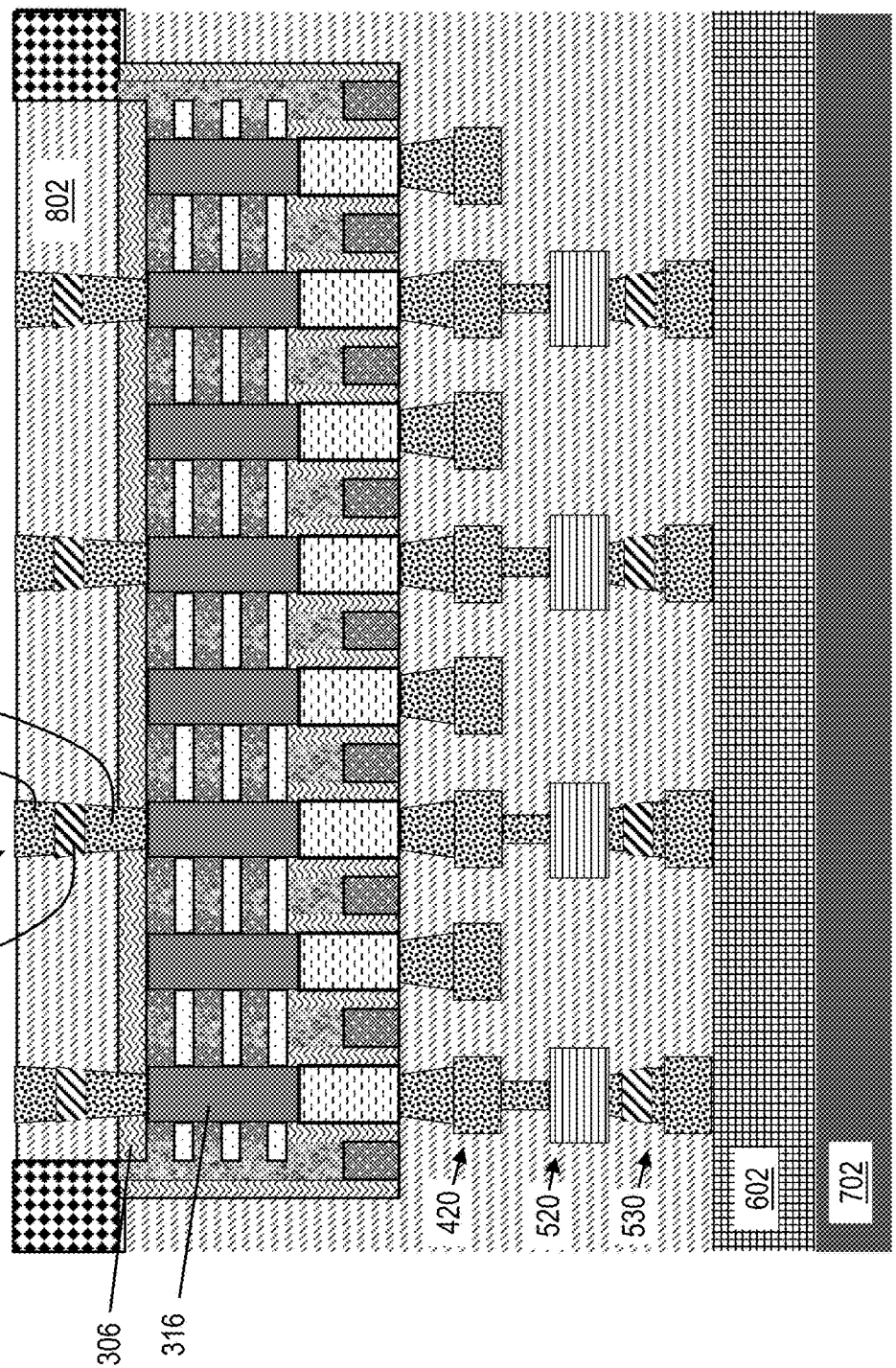
FIG. 9 depicts a cross-sectional view of a portion of an IC under-fabrication after fabrication operations according to one or more embodiments of the invention.

FIG. 9 depicts a cross-sectional view of a portion of the IC 300 under-fabrication after fabrication operations. FIG. 9 illustrates backside MOL formation in order to make contact with the S/D epitaxial material 316. In the backside MOL formation, backside interconnect structures 930 are formed through the bottom dielectric isolation layer to contact the respective S/D epitaxial material 316. Each backside interconnect structure 930 includes a via 932, a TSS device 934, and a via 936. It should be noted that the metal vias 932 and 936 (as well as metal vias 932A and 936A discussed below) are not simply vias per se. The TSS is integrated in the via itself. Depending on the material used for the bistable resistive element, different types of conductive materials (metals for example) are chosen for the vias to work in conjunction with the switching material. As such, the metal vias 532 and 536 can be different conductive materials. Each backside interconnect structure 930 is contacting the same S/D epitaxial material 316 (e.g., the same source/drain region) as a corresponding memory element 524 but on an opposite side of the S/D epitaxial material 316. In one or more embodiments, the TSS device 934 and the TSS device 534 are formed on opposite sides of the same S/D epitaxial material 316. In one or more embodiments discussed herein, the TSS device 534 may be omitted according to the examples discussed in FIGS. 2A, 2B, and 2C.

Figure 10:
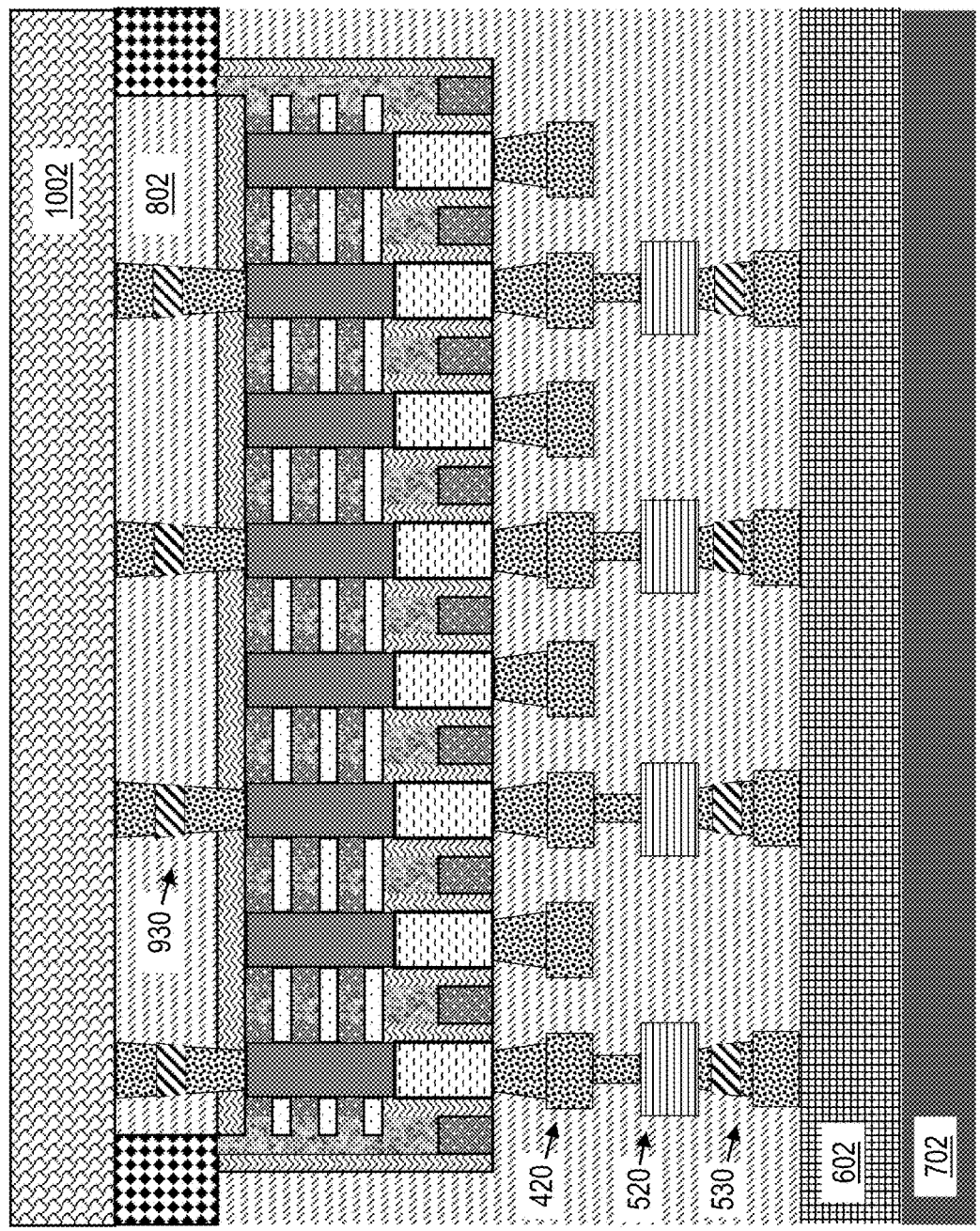
FIG. 10 depicts a cross-sectional view of a portion of an IC under-fabrication after fabrication operations according to one or more embodiments of the invention.

FIG. 10 depicts a cross-sectional view of a portion of the IC 300 under-fabrication after fabrication operations. FIG. 10 illustrates formation of a backside power delivery network (BSPDN) layer 1002. The BSPDN layer 1002 which includes routing capability to enable logic circuits using interconnections between transistors as well as power lines. Examples of logic circuits include AND gates, OR gates, NOR gates, etc. The details of the BSPDN layer 1002 are not illustrated so as not to obscure the figure.

Figure 11:
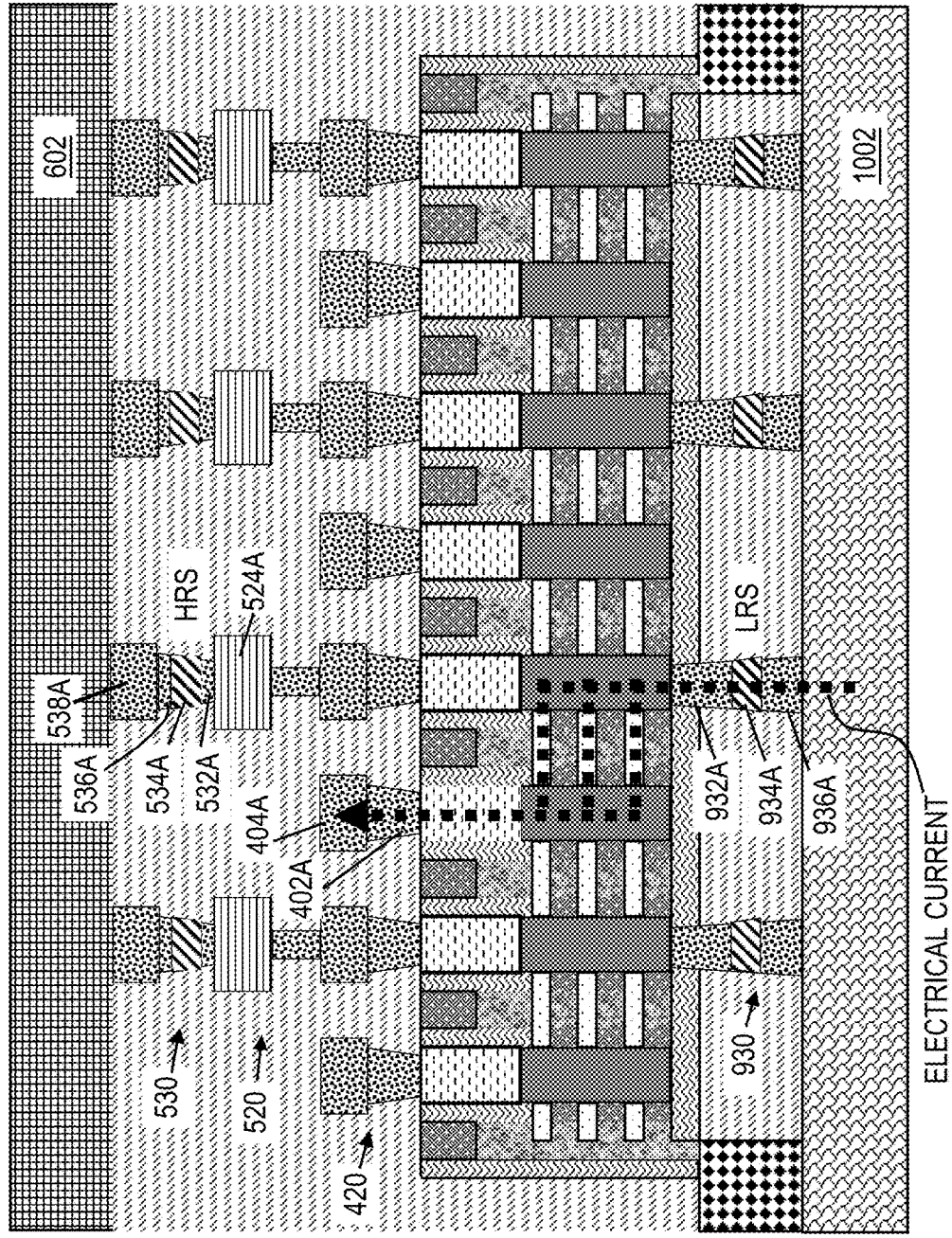
FIG. 11 depicts a cross-sectional view of a portion of an IC as an example configuration for a front side memory element and backside power delivery network with one contact to each transistor according to one or more embodiments of the invention.
Figure 12:
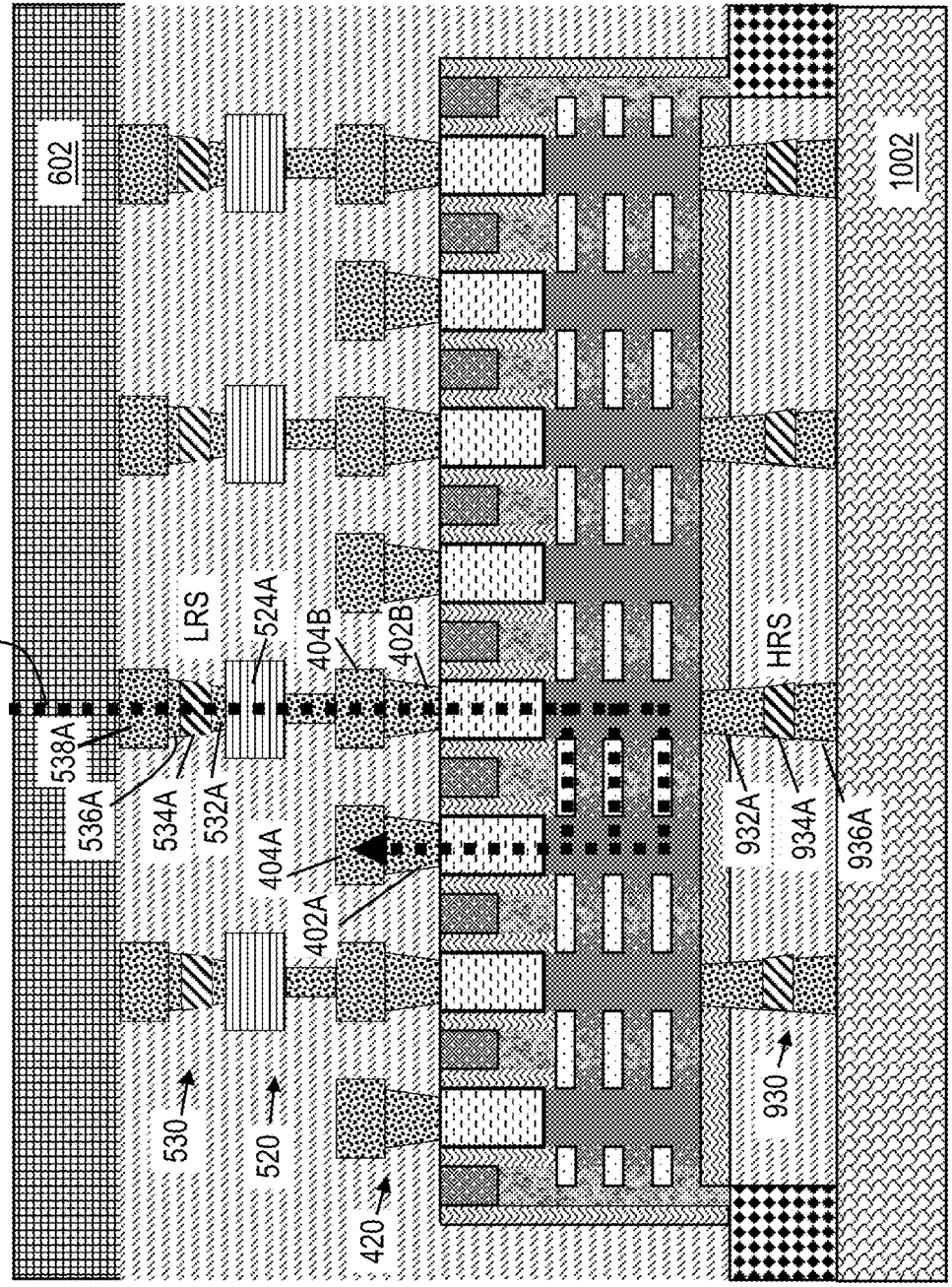
FIG. 12 depicts a cross-sectional view of a portion of an IC as an example configuration for a front side memory element and backside power delivery network with one contact to each transistor according to one or more embodiments of the invention.

FIGS. 11 and 12 depict cross-sectional views of a portion of the IC 300 after flipping the wafer such that the front side is up and removal of the carrier wafer 702. FIGS. 11 and 12 depict a final configuration for a front side memory element and backside power delivery network with one contact to each FET. Each given transistor can serve two possible functionalities: logic function for a logic circuit and driver for embedded memories. The dynamic functionality switch is based on real-time circuit requirements/needs.

FIG. 11 illustrates the transistor operating in logic function for a logic circuit. In FIG. 11, power is supplied to a logic circuit of a logic device in the BSPDN layer 1002. The TSS device 934A of a backside interconnect structure 930 is in a low resistance state (LRS) and the TSS device 534A of an interconnect structure 530 is in a high resistance state (HRS), by applying voltage as discussed in FIGS. 1A, 1B, and 1C. As such, electrical current flows from the logic circuit in the BSPDN layer 1002, through a via 936A, through the TSS device 934A, through the via 932A, into one source/drain epitaxial material 316 of the transistor, through the channel layers 308, into the other source/drain epitaxial material 316, out through the source/drain contact 318, into a via 402A, and out through the M1 metal line 404A. Because of the high resistance state of the TSS device 534A in series with the memory element 524A, no parasitic electrical current flows through memory element 524A.

FIG. 12 illustrates the transistor operating as a memory driver. In FIG. 12, power is supplied to the memory array circuit in the BEOL layer 602. Unlike FIG. 11, the TSS device 934A of a backside interconnect structure 930 is in a high resistance state (HRS) and the TSS device 534A of an interconnect structure 530 is in a low resistance state (LRS), by applying voltage as discussed in FIGS. 1A, 1B, and 1C. As such, electrical current flows from the memory array circuit in the BEOL layer 602, through an M3 metal line 538A, through via 536A, through the TSS device 534A, through the via 532A, into the memory element 524A, through an NVM bottom contact 522, through M1 metal line 404B, through via 402B, into one source/drain contact 318, into one source/drain epitaxial material 316 of the transistor, through the channel layers 308, into the other source/drain epitaxial material 316, out through another source/drain contact 318, into a via 402A, and out through the M1 metal line 404A. Because of the high resistance state of the TSS device 934A in series with the logic circuit (of a logic device), no parasitic electrical current flows through logic device in series with the TSS device 934A.

Figure 13:
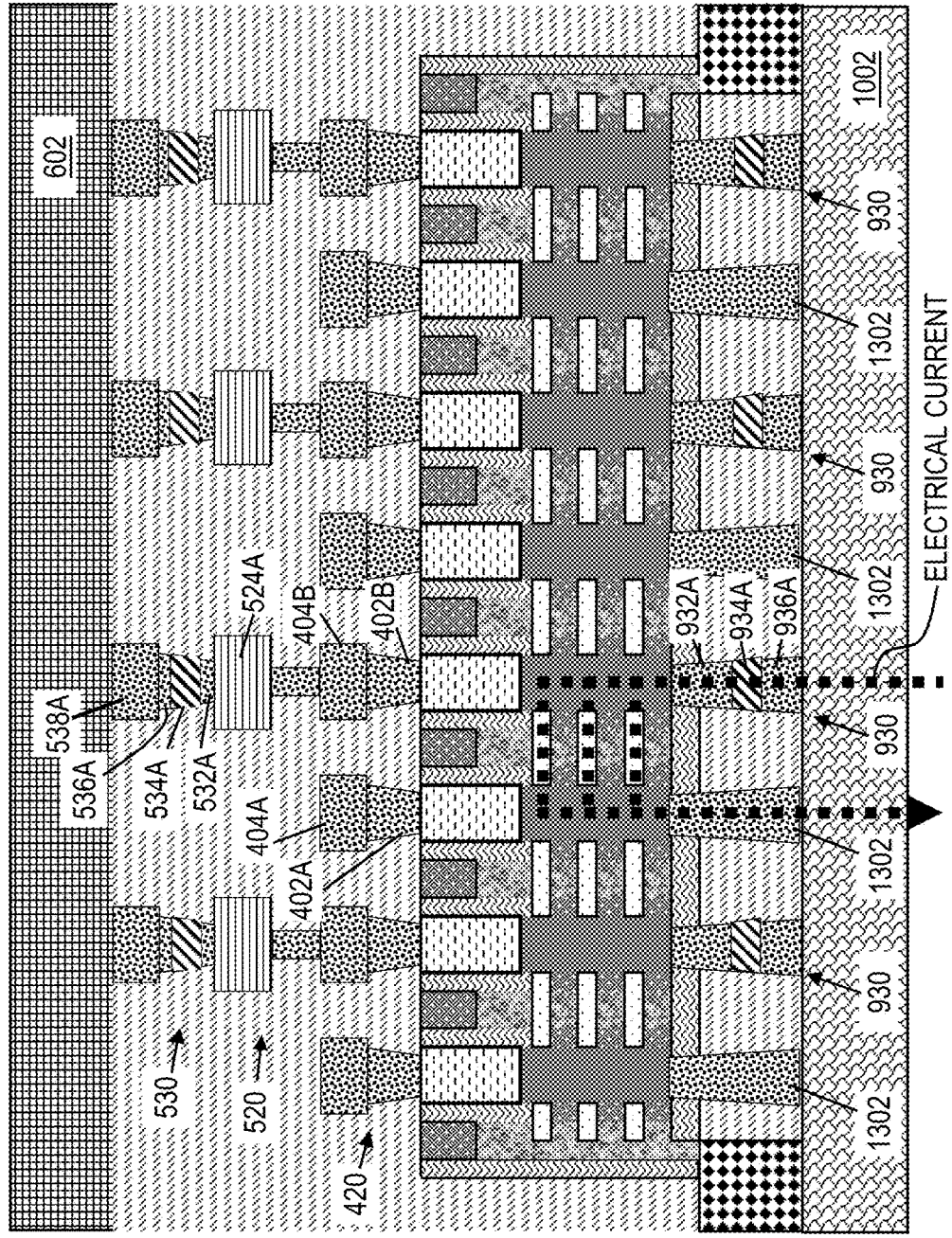
FIG. 13 depicts a cross-sectional view of a portion of an IC as another example configuration for a front side memory element and backside power delivery network with one contact to each transistor according to one or more embodiments of the invention.
Figure 14:
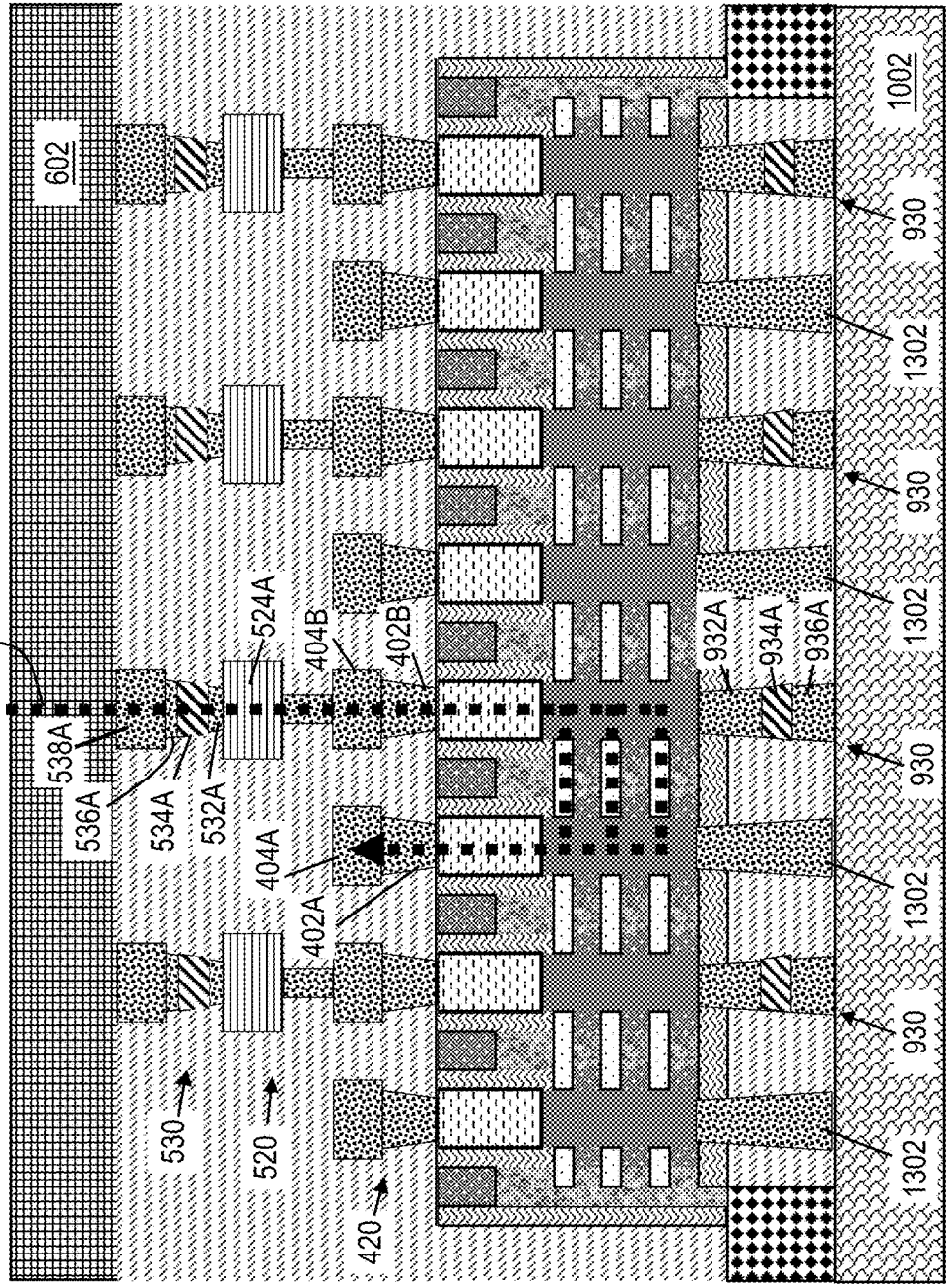
FIG. 14 depicts a cross-sectional view of a portion of an IC as another example configuration for a front side memory element and backside power delivery network with one contact to each transistor according to one or more embodiments of the invention.

FIGS. 13 and 14 depict cross-sectional views of a portion of the IC 300 after forming backside interconnect structures 1302 in contact with the source/drain epitaxial material 316 and then flipping the wafer such that the front side is up. The backside interconnect structures 1302 are formed of conductive materials including metals, metal alloys, etc. FIGS. 13 and 14 depict another final configuration for a front side memory element and backside power delivery network with one contact to each FET. Again, the same transistor can serve two possible functionalities: logic function for a logic circuit and driver for embedded memories. The dynamic function switch is based on real-time circuit requirements.

FIG. 13 illustrates the transistor operating in logic function for a logic circuit. In FIG. 13, power is supplied to a logic circuit of a logic device in the BSPDN layer 1002. The TSS device 934A of a backside interconnect structure 930 is in a low resistance state (LRS) and the TSS device 534A of an interconnect structure 530 is in a high resistance state (HRS), by applying voltage as discussed in FIGS. 1A, 1B, and 1C. As such, electrical current flows from the logic device in the BSPDN layer 1002, through a via 936A, through the TSS device 934A, through the via 932A, into one source/drain epitaxial material 316 of the transistor, through the channel layers 308, into the other source/drain epitaxial material 316, out through the backside interconnect structure 1302, and back into the BSPDN layer 1002. Because of the high resistance state of the TSS device 534A in series with the memory element 524A, no parasitic electrical current flows through memory element 524A.

FIG. 14 illustrates the transistor operating as a memory driver for the memory element 524. In FIG. 14, power is supplied to the memory array circuits in the BEOL layer 602. Unlike FIG. 13, the TSS device 934A of a backside interconnect structure 930 is in a high resistance state (HRS) and the TSS device 534A of an interconnect structure 530 is in a low resistance state (LRS), by applying voltage as discussed in FIGS. 1A, 1B, and 1C. As such, electrical current flows from the memory array circuits in the BEOL layer 602, through an M3 metal line 538A, through via 536A, through the TSS device 534A, through the via 532A, into the memory element 524A, through an NVM bottom contact 522, through M1 metal line 404B, through via 402B, into one source/drain contact 318, into one source/drain epitaxial material 316 of the transistor, through the channel layers 308, into the other source/drain epitaxial material 316, out through another source/drain contact 318, into a via 402A, and out through the M1 metal line 404A. Because of the high resistance state of the TSS device 934A in series with the logic circuit (of a logic device), no parasitic electrical current flows through logic device in series with the TSS device 934A.

Figure 15:
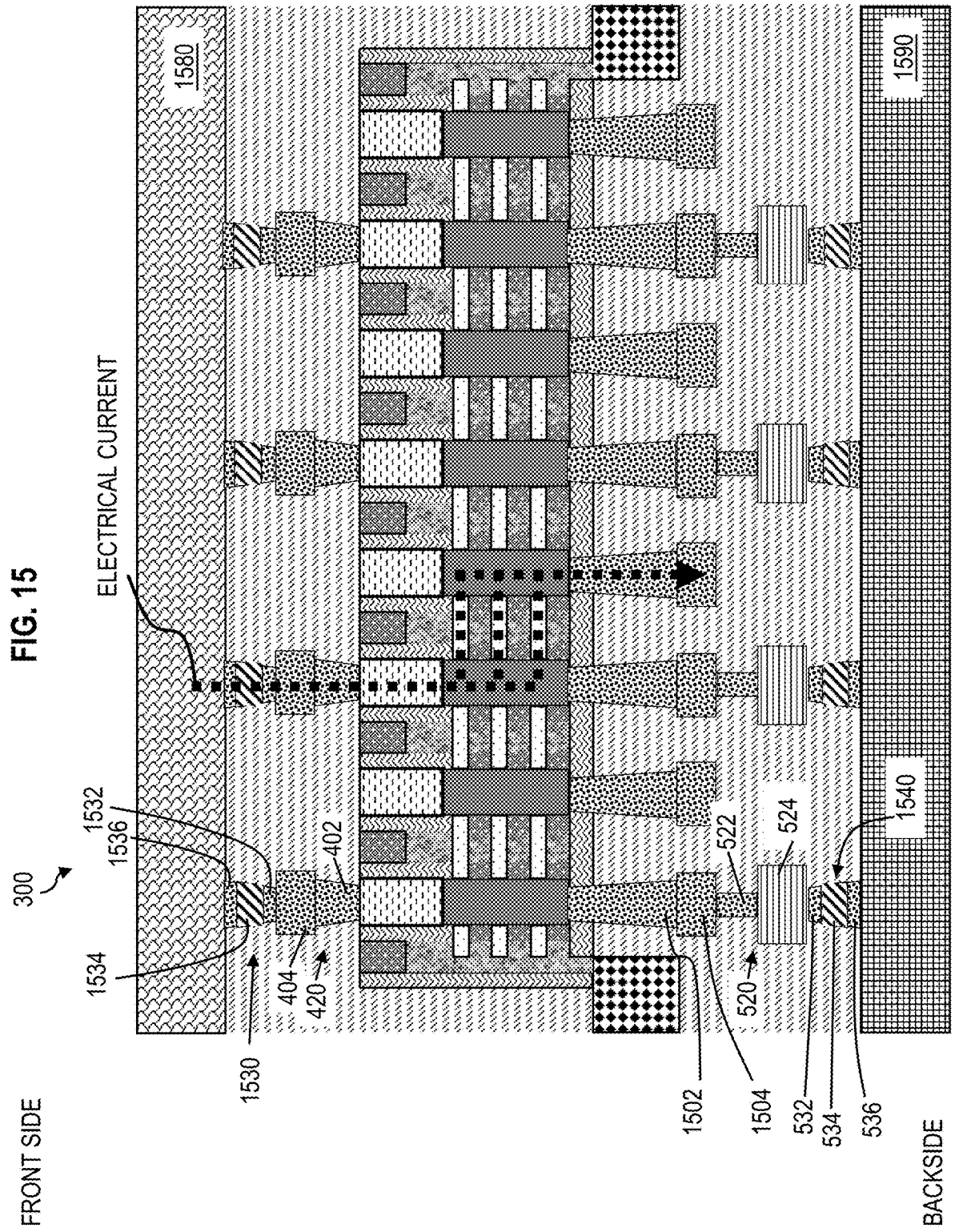
FIG. 15 depicts a cross-sectional view of a portion of an IC as an example configuration for a backside memory element and back-end-of-line layer with one contact to each transistor according to one or more embodiments of the invention.
Figure 16:
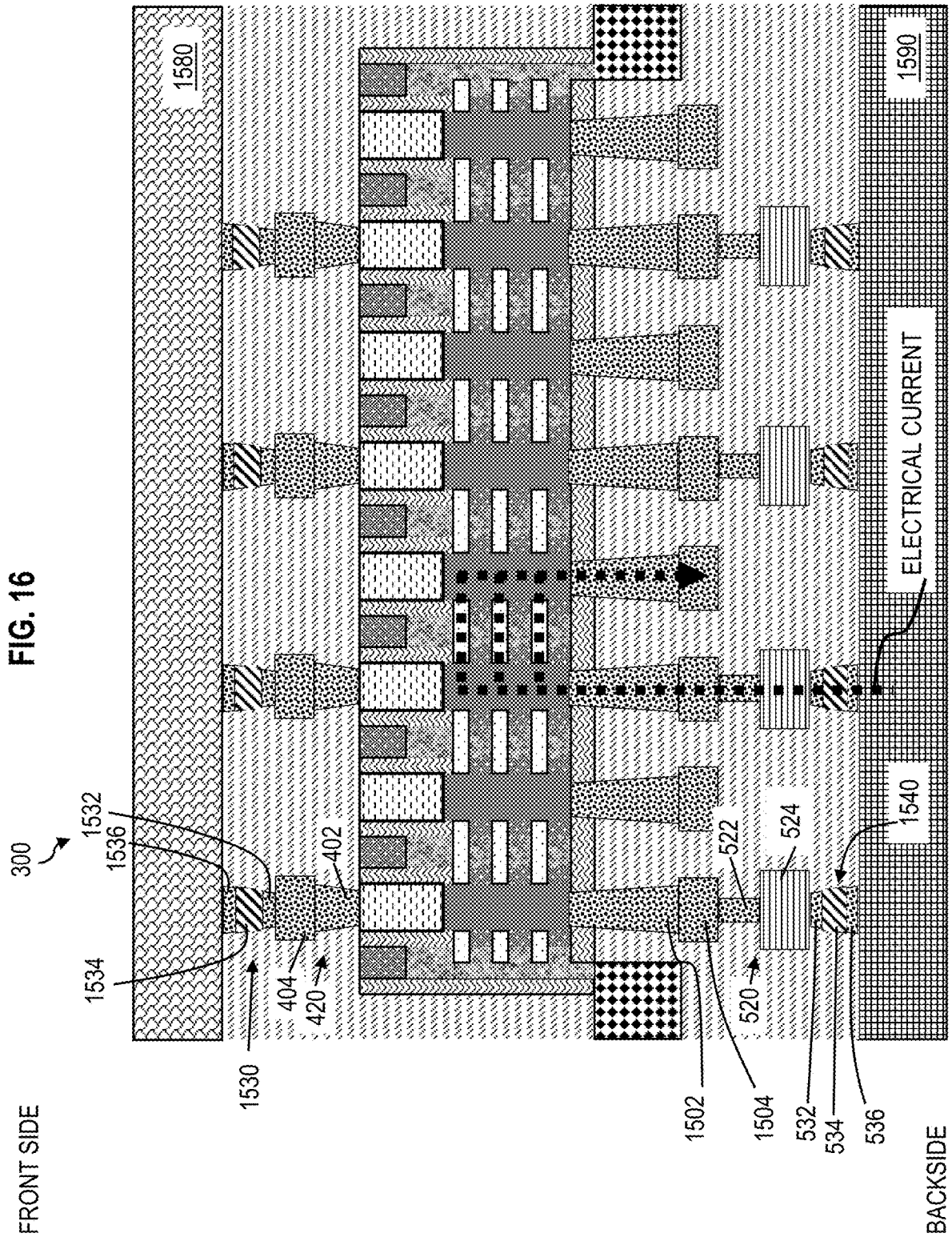
FIG. 16 depicts a cross-sectional view of a portion of an IC as another example configuration for a backside memory element and back-end-of-line layer with one contact to each transistor according to one or more embodiments of the invention.

FIGS. 15 and 16 depict cross-sectional views of a portion of the IC 300. FIGS. 15 and 16 depict a final configuration for a backside memory element and back-end-of-line with one contact to each FET. Each given transistor can serve two possible functionalities: logic function of a logic circuit and driver for embedded memories. The dynamic function switch is based on real-time circuit requirements. Unlike FIGS. 11 and 12, the arrangement of the memory elements and logic devices are formed on opposite sides of the wafer in FIGS. 15 and 16. Particularly, the memory elements 524 are formed on the backside of the wafer while the logic circuits of logic devices are formed on the front side of the wafer.

On the front side of the wafer, interconnect structures 1530 are analogous to the interconnect structures 930. Each interconnect structure 1530 includes a via 1532, a TSS device 1534, and a via 1536. Each interconnect structure 1530 is connected to a BEOL layer 1580 having the routing of logic circuits for logic devices on the front side of the wafer, analogous to the BSPDN layer 1002. An interconnect structure 1530 is in series with a logic device in the BEOL layer 1580.

On the backside of the wafer, interconnect structure 1502 is in contact with the source/drain epitaxial material 316. A metal line 1504 is in contact with the interconnect structure 1502. In this configuration, the structure 520 is on the backside, where the an NVM bottom contact 522 is the metal line 1504 and the memory element 524. For an interconnect structure 1540, the via 532 contacts the memory element 524, the TSS device 534 contacts the via 532, and the via 536 contacts the TSS device 534. The via 536 is in contact with a backside routing layer 1590 with its memory array circuits. The backside routing layer 1590 is analogous to the BEOL layer 602 with memory array circuits. The backside routing layer 1590 includes a power delivery network.

FIG. 15 illustrates the transistor operating in logic function for a logic circuit. In FIG. 15, power is supplied to a logic circuit via the BEOL layer 1580. The TSS device 1534 of a (front side) interconnect structure 1530 is in a low resistance state (LRS) and the TSS device 534 of a (backside) interconnect structure 1540 is in a high resistance state (HRS), by applying voltage as discussed in FIGS. 1A, 1B, and 1C. As such, electrical current flows from the logic device in the routing layer 1580, through a via 1536, through the TSS device 1534, through the via 1532, into metal line 404, through via 402, into one source/drain contact 318, into one source/drain epitaxial material 316 of the transistor, through the channel layers 308, into the other source/drain epitaxial material 316, out through the interconnect structure 1502, and into the metal line 1504. Because of the high resistance state of the TSS device 534 in series with the memory element 524, no parasitic electrical current flows through memory element 524.

FIG. 16 illustrates the transistor operating as a memory driver for the memory element 524. In FIG. 16, power is supplied to the memory array circuits in the routing layer 1590. Unlike FIG. 15, the TSS device 1534 of the interconnect structure 1530 is in a high resistance state (HRS) and the TSS device 534 of an interconnect structure 1540 is in a low resistance state (LRS), by applying voltage as discussed in FIGS. 1A, 1B, and 1C. As such, electrical current flows from the memory array circuits in the routing layer 1590, through the via 536, through the TSS device 534, through the via 532, into the memory element 524, through an NVM bottom contact 522, through metal line 1504, through interconnect structure 1502, into one source/drain epitaxial material 316 of the transistor, through the channel layers 308, into the other source/drain epitaxial material 316, out through another interconnect structure 1502, and out through another metal line 1504. Because of the high resistance state of the TSS device 1534 in series with the logic circuit (of a logic device), no parasitic electrical current flows through logic device in series with the TSS device 1534.

Figure 17:
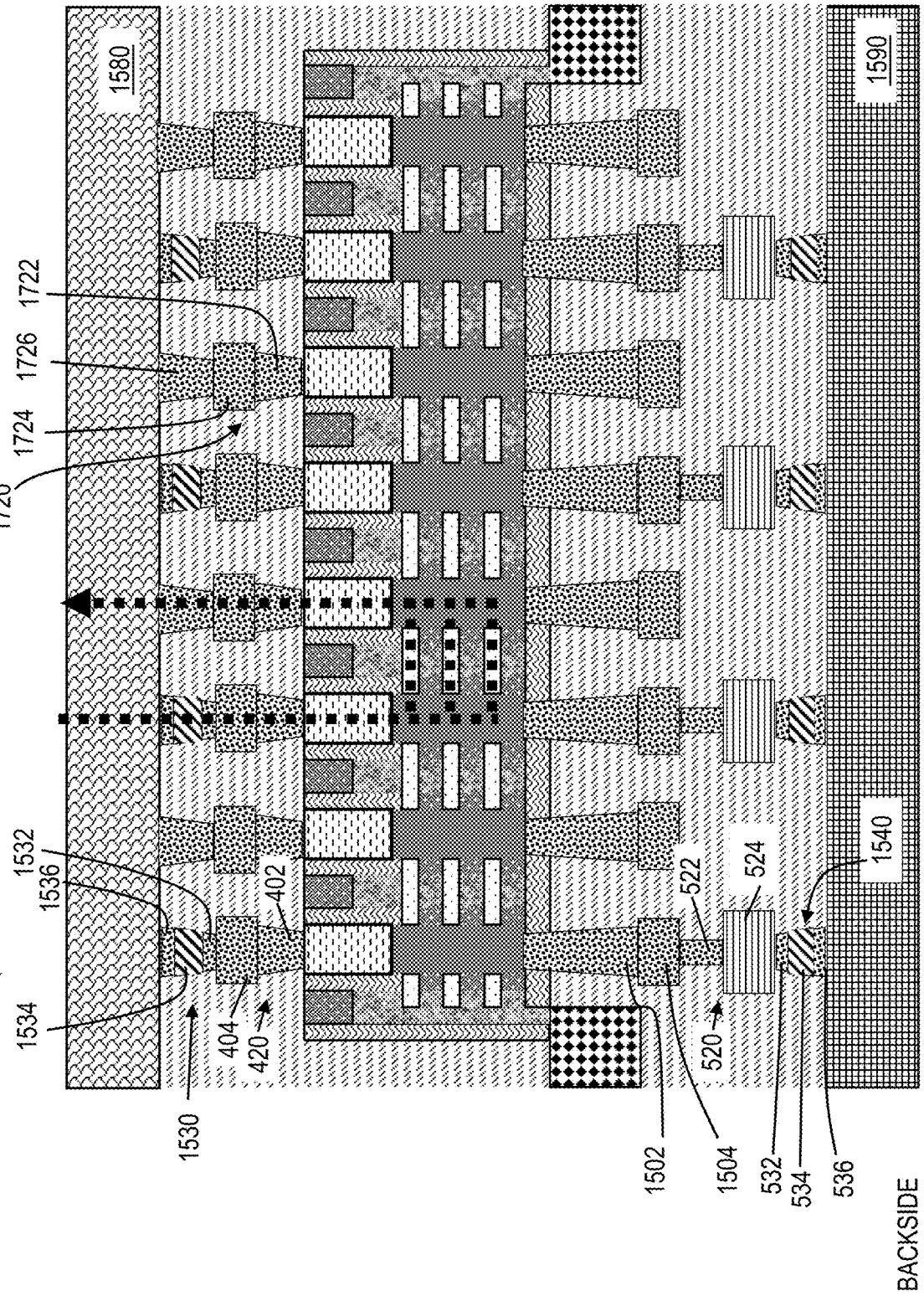
FIG. 17 depicts a cross-sectional view of a portion of an IC as an example configuration for a backside memory element and back-end-of-line layer with two contacts to each transistor according to one or more embodiments of the invention.
Figure 18:
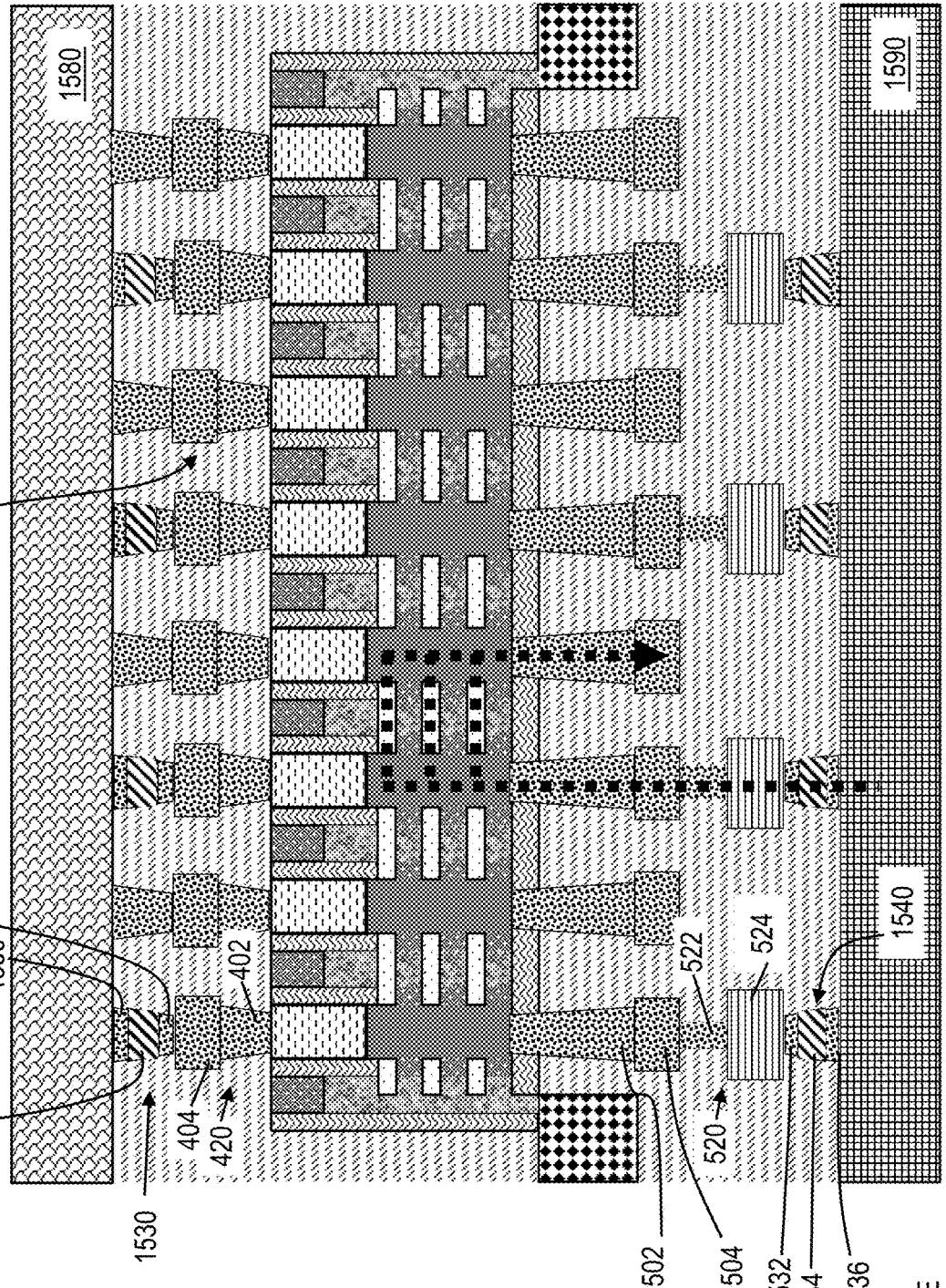
FIG. 18 depicts a cross-sectional view of a portion of an IC as another example configuration for a backside memory element and back-end-of-line layer with two contacts to each transistor according to one or more embodiments of the invention.

FIGS. 17 and 18 depict cross-sectional views of a portion of the IC 300. FIGS. 17 and 18 depict another final configuration for a backside memory element and back-end-of-line with two contacts to each FET. Each given transistor can serve two possible functionalities: logic function of a logic circuit and driver for embedded memories. The dynamic function switch is based on real-time circuit requirements. Unlike FIGS. 13 and 14, the arrangement of the memory elements and logic devices are formed on opposite sides of the wafer in FIGS. 17 and 18. Particularly, the memory elements 524 are formed on the backside of the wafer while the logic circuits of logic devices are formed on the front side of the wafer.

On the front side of the wafer (as discussed in FIGS. 15 and 16), interconnect structures 1530 are analogous to the interconnect structures 930. Each interconnect structure 1530 includes a via 1532, a TSS device 1534, and a via 1536. Each interconnect structure 1530 is connected to a BEOL layer 1580 having the routing of logic circuits for logic devices on the front side of the wafer, analogous to the BSPDN layer 1002. An interconnect structure 1530 is in series with a logic device in the BEOL layer 1580. In addition to the structures in FIGS. 15 and 16, FIGS. 17 and 18 further include, on the front side of the wafer, an interconnect structure 1720 is in contact with the BEOL layer 1580 and one source/drain contact 318 of the transistor.

On the backside of the wafer (as discussed in FIGS. 15 and 16), interconnect structure 1502 is in contact with the source/drain epitaxial material 316. A metal line 1504 is in contact with the interconnect structure 1502. In this configuration, the structure 520 is on the backside, where the an NVM bottom contact 522 is the metal line 1504 and the memory element 524. For an interconnect structure 1540, the via 532 contacts the memory element 524, the TSS device 534 contacts the via 532, and the via 536 contacts the TSS device 534. The via 536 is in contact with a backside routing layer 1590 with its memory array circuits. The backside routing layer 1590 is analogous to the BEOL layer 602 with memory array circuits. The backside routing layer 1590 includes a power delivery network.

FIG. 17 illustrates the transistor operating in logic function for a logic circuit. In FIG. 17, power is supplied to a logic circuit of a logic device in the BEOL layer 1580. The TSS device 1534 of a (front side) interconnect structure 1530 is in a low resistance state (LRS) and the TSS device 534 of a (backside) interconnect structure 1540 is in a high resistance state (HRS), by applying voltage as discussed in FIGS. 1A, 1B, and 1C. As such, electrical current flows from the logic device in the routing layer 1580, through a via 1536, through the TSS device 1534, through the via 1532, into the metal line 404, through the via 402, into one source/drain contact 318, into one source/drain epitaxial material 316 of the transistor, through the channel layers 308, into the other source/drain epitaxial material 316 of the transistor, out through the via 1722, through the metal line 1724, through the via 1726, and back into the routing layer 1580. Because of the high resistance state of the TSS device 534 in series with the memory element 524, no parasitic electrical current flows through memory element 524.

FIG. 18 illustrates the transistor operating as a memory driver for the memory element 524. In FIG. 18, power is supplied to the memory array circuits in the routing layer 1590. Unlike FIG. 17, the TSS device 1534 of the interconnect structure 1530 is in a high resistance state (HRS) and the TSS device 534 of an interconnect structure 1540 is in a low resistance state (LRS), by applying voltage as discussed in FIGS. 1A, 1B, and 1C. As such, electrical current flows from the memory array circuits in the routing layer 1590, through the via 536, through the TSS device 534, through the via 532, into the memory element 524, through an NVM bottom contact 522, through metal line 1504, through interconnect structure 1502, into one source/drain epitaxial material 316 of the transistor, through the channel layers 308, into the other source/drain epitaxial material 316, out through another interconnect structure 1502, and out through another metal line 1504. Because of the high resistance state of the TSS device 1534 in series with the logic circuit (of a logic device), no parasitic electrical current flows through logic device in series with the TSS device 1534.

It should be appreciated that embodiments are not meant to be limited by use of the front side or backside of the wafer. Rather, illustrations show that the same transistor can be utilized for logic circuits and for driving the memory elements in any configuration, whether the front side or backside, according to one or more embodiments of the invention.

FIG. 19 is a flowchart of a computer-implemented method 1900 of providing a new circuit architecture using the same transistor with dynamic dual functionality for logic and embedded memory drivers according to one or more embodiments. At block 1902, the method 1900 includes providing a transistor coupled to a memory element 524, the memory element 524 being in series with a first bistable resistive element (e.g., TSS device 534) that is configured to switch between a first low resistance state and a first high resistance state. At block 1904, the method 1900 includes providing a logic circuit (e.g., via layers 1002, 1580) coupled to the transistor via a series connection to a second bistable resistive element, the second bistable resistive element (e.g., TSS device 934, 1534) being configured to switch between a second low resistance state and a second high resistance state.

The memory element 524 is configured to form a circuit with the transistor in which the circuit excludes/prevents electrical current flow to (although there is a physical connection) and/or electrically isolates the logic circuit (e.g., via layer 1002, 1580). The circuit defines the flow of electrical current. The logic circuit (e.g., via layer 1002, 1580) is configured to form a circuit with the transistor in which the circuit excludes/prevents electrical current flow to and/or electrically isolates the memory element 524.

The memory element 524 is coupled to a memory array circuit in a back-end-of-line network (e.g., BEOL layer 602) on a front side, the front side being above the transistor. The logic circuit is part of a network (e.g., via layer 1002, 1580) for routing logic circuits and delivering power. The memory element 524 and the logic circuit are formed on opposite sides of the transistor.

The front side of the wafer (above the transistor) includes a middle-of-the-line (MOL) and back-end-of-the-line (BEOL) electrical network. The back side of the wafer (below the transistor) includes the backside electrical network. In any implementation whether memory on top or bottom, these electrical networks support the memory elements they are routed to enable memory (memory array) operation, and these electrical networks support the transistor they are routed to enable standard transistor operation (i.e., logic function of the logic elements, circuits, and/or devices). Both of them can have power delivery capability.

A circuit with the transistor and the memory element 524 excludes/prevents electrical current flow to and/or electrically isolates any terminal of the transistor that connects to the logic circuit. A circuit with the transistor and the logic circuit excludes/prevents electrical current flow to and/or electrically isolates any terminal of the transistor that connects to the memory element.

The first and second bistable resistive elements (e.g., TSS device 934, 1534) each include a unipolar, abrupt, reversible, and electrically triggered resistance switch that operates between two stable resistance states. At least one of the first and second bistable resistive elements (e.g., TSS device 934, 1534) includes an insulator-to-metal transition material. The insulator-to-metal transition material includes $VO_2$, $NbO_2$, $Ca_2RuO_4$, $LaCoO_3$, $Ti_2O_3$, $Ti_3O_5$, $SmNiO_3$, $NdNiO_3$, $V_2O_3$, $V_4O_7$, $Fe_3O_4$, an oxide of the form $ABO_3$-perovskite, and/or any combinations thereof.

At least one of the first and second bistable resistive elements (e.g., TSS device 934, 1534) includes a threshold-switching selector. The threshold-switching selector includes a combination of a thin insulator layer with a metal such as Ag-doped $HfO_2$, $Cu/HfO_2$, $Ag/TiO_2$, $CU_xS$, Ag/a-Si, $AgTe/TiN/TiO_2/TiN$, $W/Cu_xS$, and/or any combinations thereof. The memory element includes non-volatile memory (NVM). The memory element 524 includes a charge trap memory, magnetic random access memory (MRAM) (such as, e.g., spin-transfer-torque (STT) MRAM, or spin-orbit torque (SOT) MRAM), ferroelectric-RAM (FRAM), phase-change memory (PCM), resistive-RAM (ReRAM) (such as oxygen vacancy RAM (OxRAM) or conductive-bridge RAM (CBRAM)), and/or any combinations thereof. The transistor is one of a planar field-effect transistor (FET), a finFET, gate-all-around (GAA) FET (e.g., GAA nanowire-FET or GAA nanosheet-FET), a vertical-transport-FET (VT-FET), and/or a stacked-FET (where PFET is stacked on NFET or vice versa). Additionally, any of these transistor architectures can be integrated on bulk substrate or silicon-on-insulator (SOI) substrate.

A first mode, to selectively operate the memory element 524, includes the first bistable resistive element in the first low resistance state and the second bistable resistive element in the second high resistance state. A second mode, to selectively operate the logic circuit, includes the first bistable resistive element in the first high resistance state and the second bistable resistive element in the second low resistance state, the first and second low resistance states permitting a flow of electrical current, the first and second high resistance states limiting a flow of electrical current.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The phrase "selective to," such as, for example, "a first element selective to a second element," means that the first element can be etched and the second element can act as an etch stop.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

As noted above, atomic layer etching processes can be used in the present invention for via residue removal, such as can be caused by via misalignment. The atomic layer etch process provide precise etching of metals using a plasma-based approach or an electrochemical approach. The atomic layer etching processes are generally defined by two well-defined, sequential, self-limiting reaction steps that can be independently controlled. The process generally includes passivation followed selective removal of the passivation layer and can be used to remove thin metal layers on the order of nanometers. An exemplary plasma-based approach generally includes a two-step process that generally includes exposing a metal such a copper to chlorine and hydrogen plasmas at low temperature (below 20° C.). This process generates a volatile etch product that minimizes surface contamination. In another example, cyclic exposure to an oxidant and hexafluoroacetylacetone (Hhfac) at an elevated temperature such as at 275° C. can be used to selectively etch a metal such as copper. An exemplary electrochemical approach also can include two steps. A first step includes surface-limited sulfidization of the metal such as copper to form a metal sulfide, e.g., $Cu_2S$, followed by selective wet etching of the metal sulfide, e.g., etching of $Cu_2S$ in HCl. Atomic layer etching is relatively recent technology and optimization for a specific metal is well within the skill of those in the art. The reactions at the surface provide high selectivity and minimal or no attack of exposed dielectric surfaces.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The photoresist can be formed using conventional deposition techniques such chemical vapor deposition, plasma vapor deposition, sputtering, dip coating, spin-on coating, brushing, spraying and other like deposition techniques can be employed. Following formation of the photoresist, the photoresist is exposed to a desired pattern of radiation such as X-ray radiation, extreme ultraviolet (EUV) radiation, electron beam radiation or the like. Next, the exposed photoresist is developed utilizing a conventional resist development process.

After the development step, the etching step can be performed to transfer the pattern from the patterned photoresist into the interlayer dielectric. The etching step used in forming the at least one opening can include a dry etching process (including, for example, reactive ion etching, ion beam etching, plasma etching or laser ablation), a wet chemical etching process or any combination thereof.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e., one, two, three, four, etc. The terms "a plurality" are understood to include any integer number greater than or equal to two, i.e., two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor structure comprising:
a transistor coupled to a memory element, the memory element being in series with a first bistable resistive element that is configured to switch between a first low resistance state and a first high resistance state; and
a logic circuit coupled to the transistor via a series connection to a second bistable resistive element, the second bistable resistive element being configured to switch between a second low resistance state and a second high resistance state.

2. The semiconductor structure of claim 1, wherein the memory element is configured to form a circuit with the transistor in which the circuit electrically isolates the logic circuit.

3. The semiconductor structure of claim 1, wherein the logic circuit is configured to form a circuit with the transistor in which the circuit electrically isolates the memory element.

4. The semiconductor structure of claim 1, wherein the memory element is coupled to a memory array circuit in a back-end-of-line network on a front side, the front side being above the transistor.

5. The semiconductor structure of claim 1, wherein the logic circuit is part of a network for routing logic functions and delivering power.

6. The semiconductor structure of claim 1, wherein the memory element and the logic circuit are formed on opposite sides of the transistor.

7. The semiconductor structure of claim 1, wherein a circuit with the transistor and the memory element electrically isolates a terminal of the transistor that connects to the logic circuit.

8. The semiconductor structure of claim 1, wherein a circuit with the transistor and the logic circuit electrically isolates a terminal of the transistor that connects to the memory element.

9. The semiconductor structure of claim 1, wherein the first and second bistable resistive elements each comprise a unipolar, abrupt, reversible, and electrically triggered resistance switch that operates between two stable resistance states.

10. The semiconductor structure of claim 1, wherein at least one of the first and second bistable resistive elements comprises an insulator-to-metal transition material.

11. The semiconductor structure of claim 10, wherein the insulator-to-metal transition material comprises $VO_2$, $NbO_2$, $Ca_2RuO_4$, $LaCoO_3$, $Ti_2O_3$, $Ti_3O_5$, $SmNiO_3$, $NdNiO_3$, $V_2O_3$, $V_4O_7$, $Fe_3O_4$, an oxide of the form $ABO_3$-perovskite, or any combinations thereof.

12. The semiconductor structure of claim 1, wherein at least one of the first and second bistable resistive elements comprises a threshold-switching selector formed by a combination of a thin insulator layer with a metal.

13. The semiconductor structure of claim 12, wherein the threshold-switching selector comprises Ag-doped $HfO_2$, $Cu/HfO_2$, $Ag/TiO_2$, $CU_xS$, Ag/a-Si, $AgTe/TiN/TiO_2/TiN$, $W/Cu_xS$, or any combinations thereof.

14. The semiconductor structure of claim 1, wherein the memory element comprises non-volatile memory (NVM).

15. The semiconductor structure of claim 1, wherein the memory element comprises charge trap memory, magnetic random access memory (MRAM), ferroelectric-RAM (FRAM), phase-change memory (PCM), resistive-RAM (ReRAM), or any combinations thereof.

16. The semiconductor structure of claim 1, wherein the transistor is one of a planar field-effect transistor (FET), a finFET, gate-all-around (GAA) FET, a vertical-transport-FET (VTFET), and a stacked-FET.

17. The semiconductor structure of claim 1, wherein:
a first mode, to selectively operate the memory element, comprises the first bistable resistive element in the first low resistance state and the second bistable resistive element in the second high resistance state; and
a second mode, to selectively operate the logic circuit, comprises the first bistable resistive element in the first high resistance state and the second bistable resistive element in the second low resistance state, the first and second low resistance states permitting a flow of electrical current, the first and second high resistance states limiting a flow of electrical current.

18. A method comprising:
providing a transistor coupled to a memory element, the memory element being in series with a first bistable resistive element that is configured to switch between a first low resistance state and a first high resistance state; and
providing a logic circuit coupled to the transistor via a series connection to a second bistable resistive element, the second bistable resistive element being configured to switch between a second low resistance state and a second high resistance state.

19. The method of claim 18, wherein:
the memory element is configured to form a circuit with the transistor in which the circuit electrically isolates the logic circuit; and
the logic circuit is configured to form another circuit with the transistor in which the another circuit electrically isolates the memory element.

20. The method of claim 18, wherein:
a first mode, to selectively operate the memory element, comprises the first bistable resistive element in the first low resistance state and the second bistable resistive element in the second high resistance state; and
a second mode, to selectively operate the logic circuit, comprises the first bistable resistive element in the first high resistance state and the second bistable resistive element in the second low resistance state, the first and second low resistance states permitting a flow of electrical current, the first and second high resistance states limiting a flow of electrical current.

* * * * *